(12) United States Patent
Hirai et al.

(10) Patent No.: US 11,872,814 B2
(45) Date of Patent: Jan. 16, 2024

(54) LIQUID EJECTING HEAD AND LIQUID EJECTING APPARATUS

(71) Applicant: SEIKO EPSON CORPORATION, Tokyo (JP)

(72) Inventors: Eiju Hirai, Azumino (JP); Yu Shiozawa, Shiojiri (JP); Masaki Mori, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 17/650,914

(22) Filed: Feb. 14, 2022

(65) Prior Publication Data
US 2022/0258472 A1    Aug. 18, 2022

(30) Foreign Application Priority Data

Feb. 16, 2021 (JP) ................................. 2021-022330

(51) Int. Cl.
| | |
|---|---|
| *B41J 2/14* | (2006.01) |
| *H10N 30/50* | (2023.01) |
| *H10N 30/20* | (2023.01) |

(52) U.S. Cl.
CPC ...... *B41J 2/14274* (2013.01); *H10N 30/2047* (2023.02); *H10N 30/50* (2023.02); *B41J 2202/03* (2013.01)

(58) Field of Classification Search
None
See application file for complete search history.

(56) References Cited

U.S. PATENT DOCUMENTS

| | | | |
|---|---|---|---|
| 2001/0007348 A1* | 7/2001 | Kusaka | H04N 25/673 250/370.15 |
| 2013/0083102 A1* | 4/2013 | Kondo | B41J 2/14209 347/9 |
| 2018/0264807 A1* | 9/2018 | Ito | B41J 2/161 |

FOREIGN PATENT DOCUMENTS

JP    2011-104916 A    6/2011

* cited by examiner

*Primary Examiner* — Erica S Lin
(74) *Attorney, Agent, or Firm* — WORKMAN NYDEGGER

(57) ABSTRACT

A liquid ejecting head includes a piezoelectric device including a first electrode, a second electrode, and a piezoelectric layer, a vibration plate that is deformed when the piezoelectric device is driven, a pressure chamber plate including a pressure chamber whose volume is changed by deformation of the vibration plate, a wiring board, an individual lead electrode through which the wiring board and the first electrode are electrically coupled to each other, a common lead electrode through which the wiring board and the second electrode are electrically coupled to each other, and a resistance wire electrically coupled to the wiring board and used to determine temperature in the pressure chamber.

12 Claims, 14 Drawing Sheets

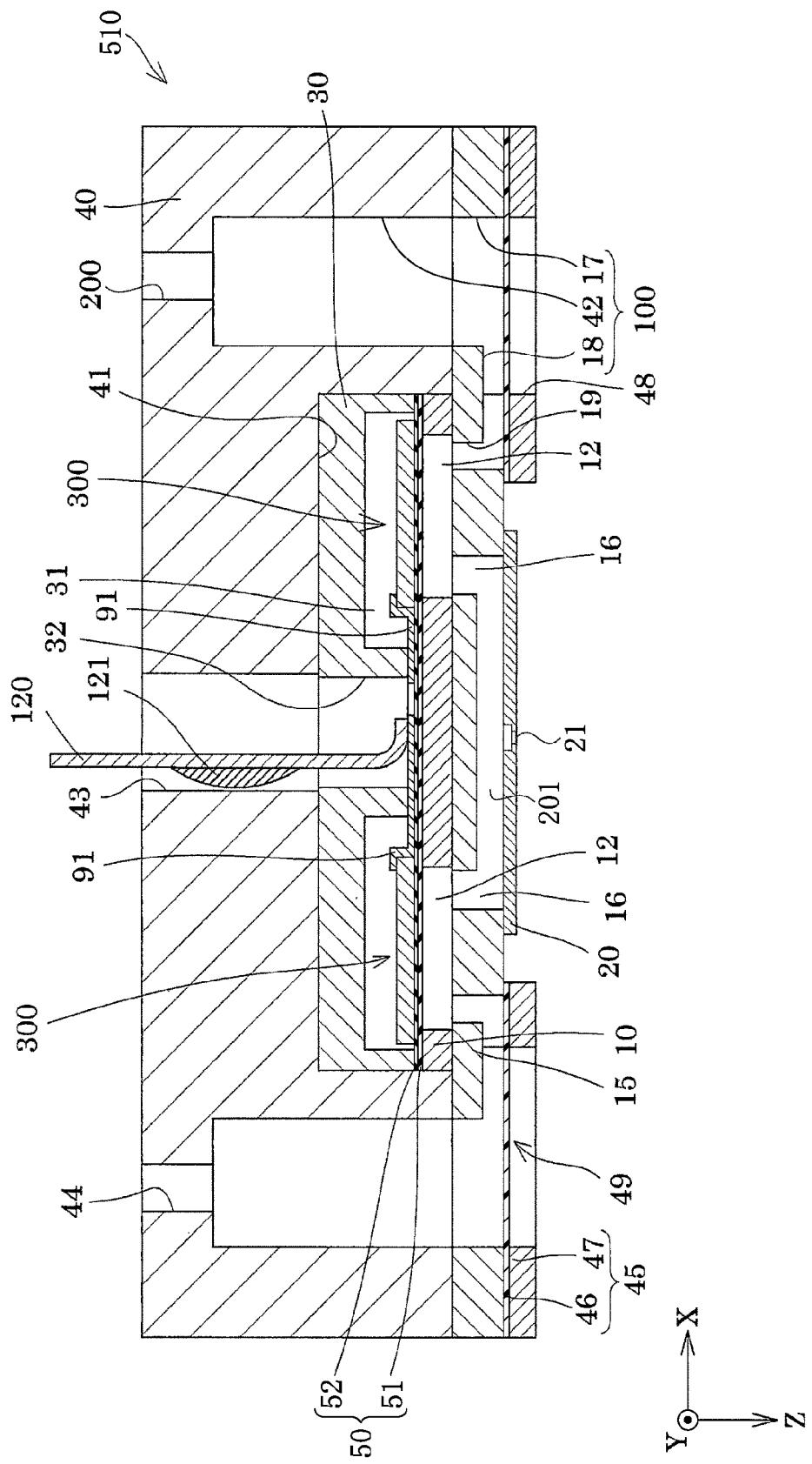

LIQUID EJECTING HEAD AND LIQUID EJECTING APPARATUS

The present application is based on, and claims priority from JP Application Serial Number 2021-022330, filed Feb. 16, 2021, the disclosure of which is hereby incorporated by reference herein in its entirety.

BACKGROUND

1. Technical Field

The present disclosure relates to a liquid ejecting head and a liquid ejecting apparatus.

2. Related Art

JP-A-2011-104916 discloses a liquid ejecting head including a piezoelectric device, a pressure chamber, and a nozzle in communication with the pressure chamber. The liquid ejecting head is mounted in a printer, which is an example of a liquid ejecting apparatus. The piezoelectric device driven by a controller changes the volume of the pressure chamber and thus ink, which is an example of a liquid supplied to the pressure chamber, is ejected through the nozzle. The printer further includes a temperature sensor on a side surface of a carriage to which the liquid ejecting head is attached. The temperature sensor measures an ambient temperature outside the liquid ejecting head. The controller controls driving of the piezoelectric device based on the ambient temperature measured by the temperature sensor.

The liquid ejecting apparatus disclosed in JP-A-2011-104916 has the temperature sensor outside the liquid ejecting head. In this configuration, a difference between a temperature measured by the temperature sensor and a temperature of ink in the pressure chamber may be larger than a difference between a temperature in the liquid ejecting head and a temperature of ink in the pressure chamber. In such a case, the liquid ejecting apparatus may fail to perform ejection control of the liquid ejecting head appropriate for temperature of ink in the pressure chamber.

SUMMARY

According to an aspect of the present disclosure, a liquid ejecting head includes a piezoelectric device including a first electrode, a second electrode, and a piezoelectric layer located between the first electrode and the second electrode in a stacking direction in which the first electrode, the second electrode, and the piezoelectric layer are stacked on top of one another, a vibration plate disposed on a first side in the stacking direction of the piezoelectric device and subjected to deformation when the piezoelectric device is driven, a pressure chamber plate disposed on the first side in the stacking direction of the vibration plate and including a plurality of pressure chambers whose volume is changed by deformation of the vibration plate, a wiring board, a first wire through which the wiring board and the first electrode are electrically coupled to each other, a second wire through which the wiring board and the second electrode are electrically coupled to each other, and a temperature detector electrically coupled to the wiring board and used to determine a temperature in the plurality of pressure chambers.

According to another aspect of the present disclosure, a liquid ejecting apparatus includes the liquid ejecting head and a controller configured to control ejection of liquid from the liquid ejecting head.

BRIEF DESCRIPTION OF THE DRAWINGS

FIG. 14 is a cross-sectional view illustrating a liquid ejecting head according to another embodiment.

DESCRIPTION OF EXEMPLARY EMBODIMENTS

Figure 1:
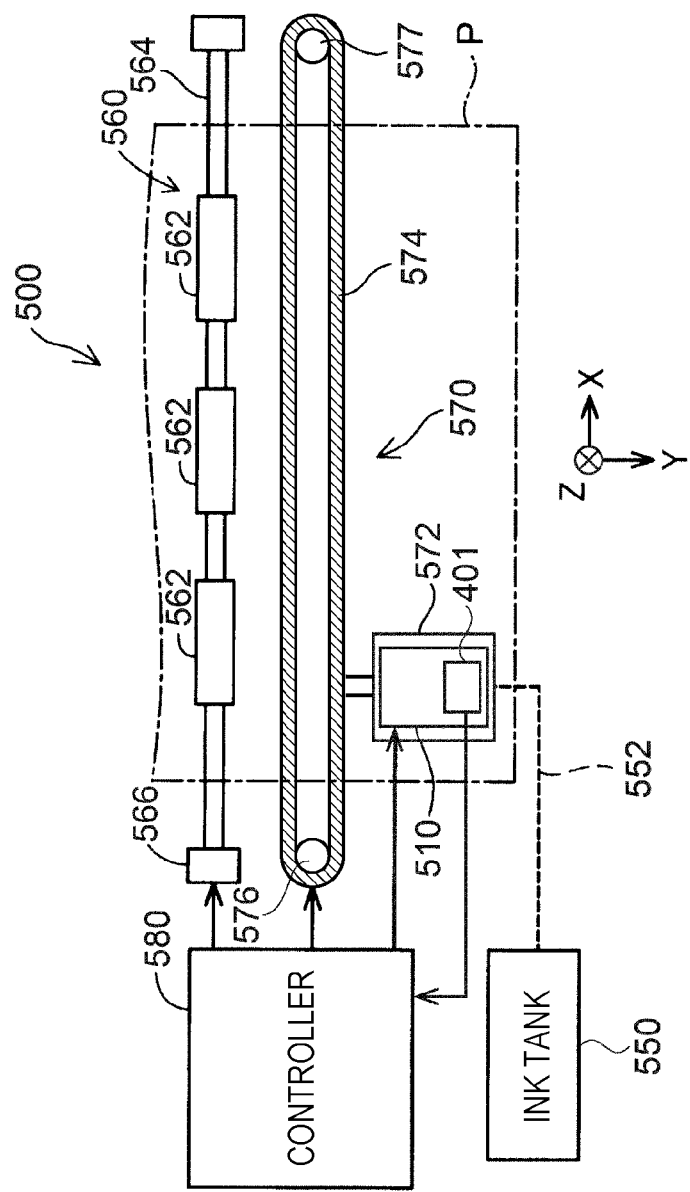
FIG. 1 is a block diagram illustrating a schematic structure of a liquid ejecting apparatus including a liquid ejecting head according to an embodiment of the present disclosure.

Hereinafter, the present disclosure is explained by using embodiments. In the drawings, identical components are assigned the same reference numerals without duplicated explanation.

In the drawings, X, Y, and Z represent three orthogonal spatial axes. In this specification, directions along the X, Y, and Z axes are, respectively, referred to as X, Y, and Z axis directions. When orientation of the directions needs to be specified, the positive direction is represented by an additional sign "+" and the negative direction is represented by an additional sign "−". The directions pointed by the arrows in the drawings are "+" directions and directions opposite the directions pointed by the arrows are "−" directions. The Z direction corresponds to the vertical direction, and the +Z direction is oriented downward in the vertical direction and the −Z direction is oriented upward in the vertical direction. The three spatial axes of X, Y, and Z without limitation of positive and negative directions are referred to as X, Y, and Z axes.

1. First Embodiment

In this embodiment, a liquid ejecting apparatus 500 is an ink jet printer that ejects ink onto a printing paper P to form an image. The ink is an example of a liquid. Instead of the printing paper P, the ink may be ejected onto any kind of medium such as a resin film and a cloth.

As illustrated in FIG. 1, the liquid ejecting apparatus 500 includes a liquid ejecting head 510, an ink tank 550, a transportation mechanism 560, a movement mechanism 570, and a controller 580.

The liquid ejecting head 510 has multiple nozzles 21 and ejects ink in the +Z direction to form an image on the printing paper P. The liquid ejecting head 510 includes a resistance wire 401, which is an example of a temperature detector. The structure of the liquid ejecting head 510 will be described later in detail. The liquid ejecting head 510 may eject four colors of ink including black, cyan, magenta, and yellow. The colors of ink are not limited to the above four colors and may be any color, such as light cyan, light magenta, and white. The liquid ejecting head 510 is mounted on a carriage 572 (described later) of the movement mechanism 570 and reciprocates in a main scanning direction together with the carriage 572. In this embodiment, the main scanning direction corresponds to the +X direction and the −X direction.

The ink tank 550 houses ink to be ejected from the liquid ejecting head 510. The ink tank 550 is not mounted on the carriage 572. The ink tank 550 is coupled to the liquid ejecting head 510 through a tube 552 formed of resin. Ink is supplied from the ink tank 550 to the liquid ejecting head 510 through the tube 552. Instead of the ink tank 550, a liquid pouch that is a bag formed of a flexible film may be employed.

The transportation mechanism 560 transports the printing paper P in a sub-scanning direction. The sub-scanning direction is perpendicular to the X axis direction, which is the main scanning direction, and corresponds to the +Y direction and the −Y direction in this embodiment. The transportation mechanism 560 includes a transportation rod 564 having three transportation rollers 562 and a transportation motor 566 configured to rotate the transportation rod 564. When the transportation rod 564 is rotated by the transportation motor 566, the transportation rollers 562 are rotated to transport the printing paper P in the +Y direction of the sub-scanning direction. The number of transportation rollers 562 is not limited to three and may be smaller or larger than three. Furthermore, the liquid ejecting apparatus 500 may include two or more transportation mechanisms 560.

The movement mechanism 570 includes a transportation belt 574, a movement motor 576, and a pulley 577, in addition to the carriage 572. The liquid ejecting head 510 mounted on the carriage 572 is ready for ejection of ink. The carriage 572 is attached to the transportation belt 574. The transportation belt 574 is wound around the movement motor 576 and the pulley 577. The transportation belt 574 is reciprocated in the main scanning direction when the movement motor 576 is driven. This reciprocates the carriage 572 attached to the transportation belt 574 in the main scanning direction.

The controller 580 controls the entire of the liquid ejecting apparatus 500. For example, the controller 580 controls reciprocation operation of the carriage 572 in the main scanning direction, transportation operation of the printing paper P in the sub-scanning direction, and ejection operation of the liquid ejecting head 510. In this embodiment, the controller 580 determines a temperature in a pressure chamber 12 (described later) by using a measurement value obtained by a temperature detector included in the liquid ejecting head 510. The controller 580 also functions as a drive controller for a piezoelectric device 300 (described later). Specifically described, the controller 580 outputs a drive signal corresponding to the determined temperature in the pressure chamber 12 to the liquid ejecting head 510 to drive the piezoelectric device 300. In this way, the controller 580 controls the ejection of ink onto the printing paper P. The controller 580 may include at least one processing circuit, such as a central processing unit (CPU) and a field programmable gate array (FPGA), and at least one memory circuit, such as semiconductor memory.

Figure 2:
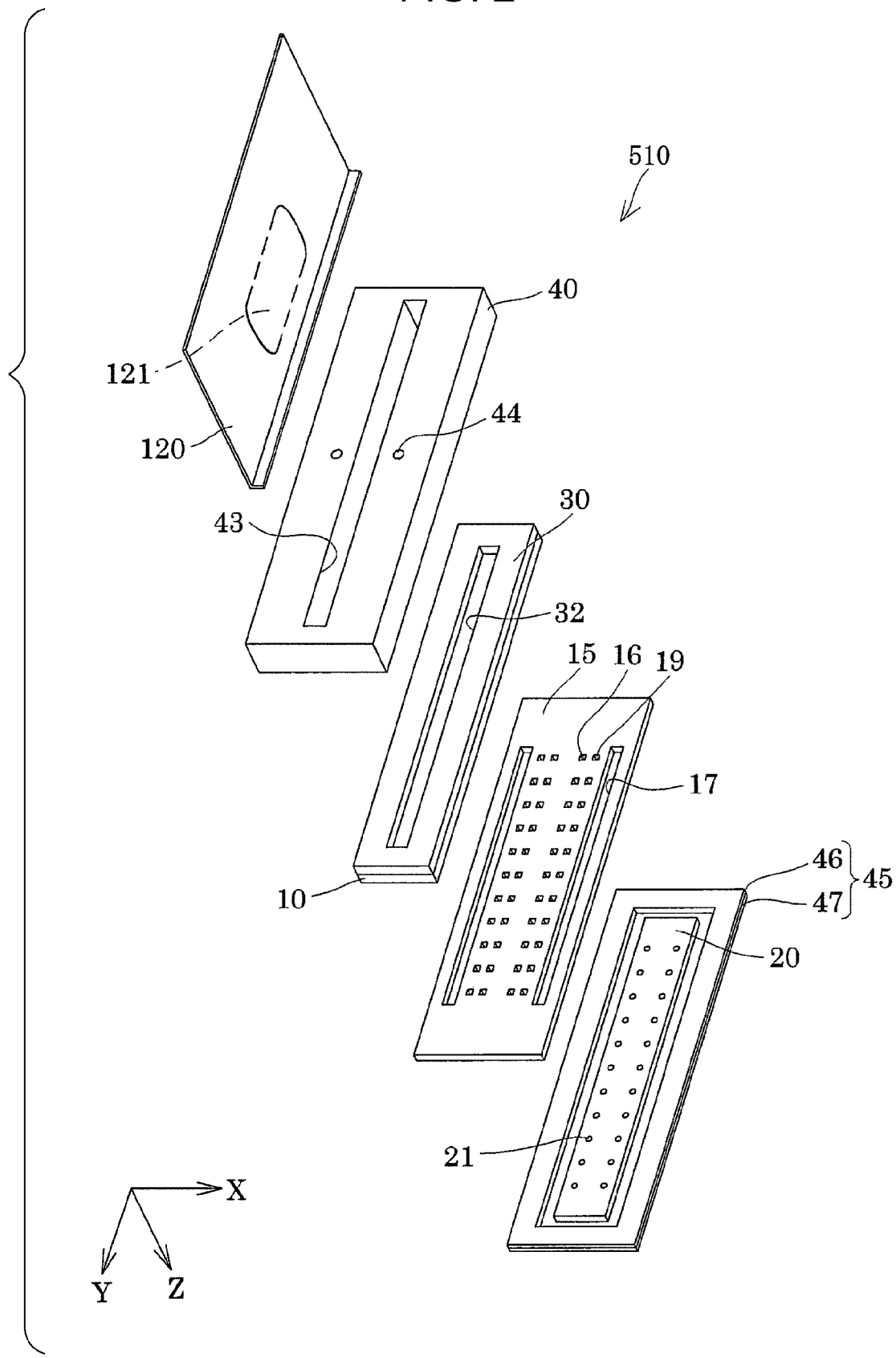
FIG. 2 is an exploded perspective view illustrating a detailed structure of the liquid ejecting head.

As illustrated in FIG. 2, the liquid ejecting head 510 ejects ink droplets in the Z axis direction, more specifically in the +Z direction. The liquid ejecting head 510 includes a pressure chamber plate 10, a communication plate 15, a nozzle plate 20, a compliance plate 45, a vibration plate 50 (described later), a piezoelectric device 300 (described later), a protection plate 30, a casing 40, and a wiring board 120, as the components. The pressure chamber plate 10, the communication plate 15, the nozzle plate 20, the compliance plate 45, the vibration plate 50, the piezoelectric device 300, the protection plate 30, and the casing 40 are stacked on top of one another, and the stack is an example of a multi-layer component that constitutes the liquid ejecting head 510.

The pressure chamber plate 10 may be formed of a silicon substrate, a glass substrate, an SOI substrate, or any ceramic substrate. The pressure chamber plate 10 is an example of a substrate.

Figure 3:
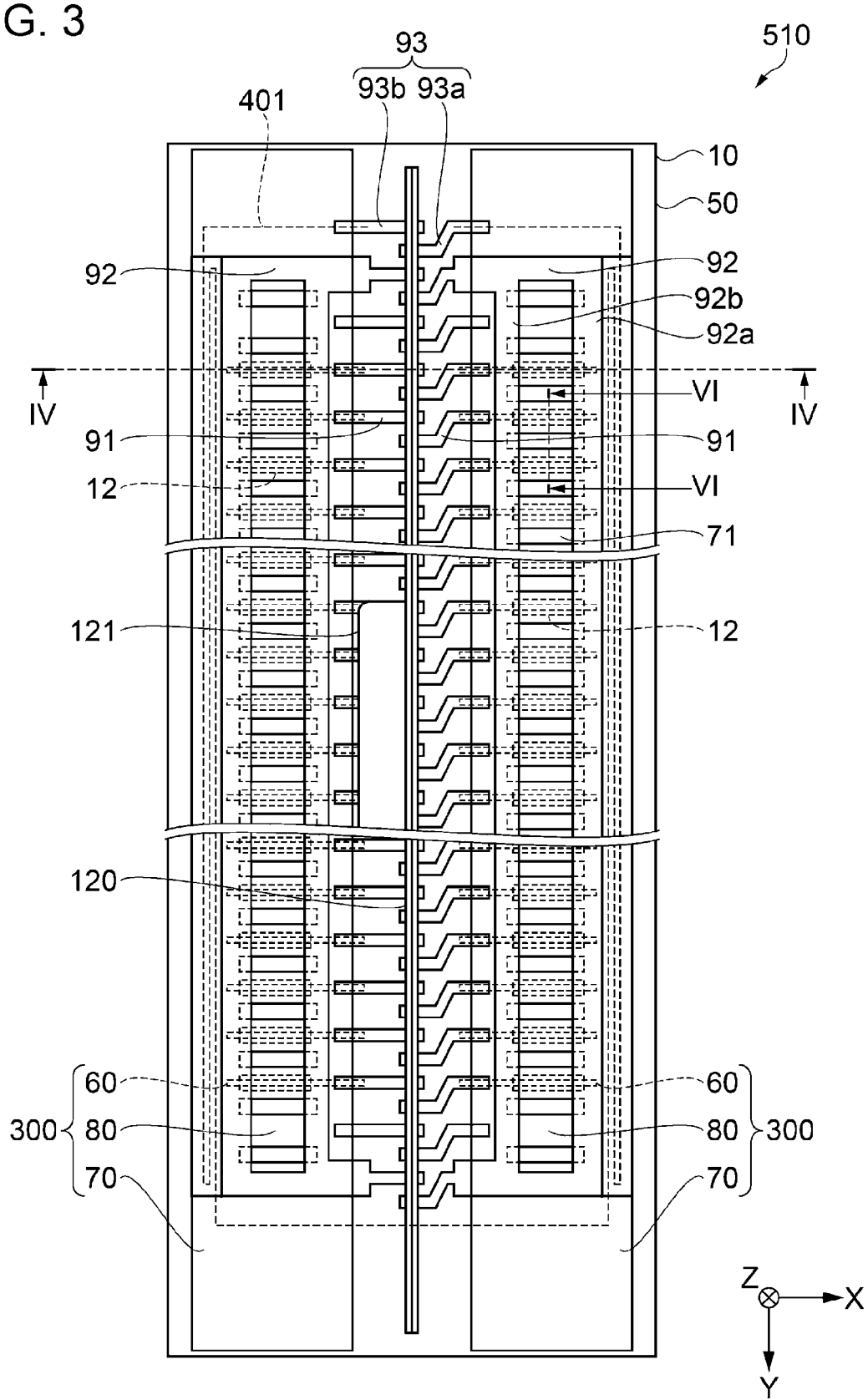
FIG. 3 is a plan view of the liquid ejecting head.

As illustrated in FIG. 3, the pressure chamber plate 10 has multiple pressure chambers 12 arranged in the Y axis direction in two lines arranged in the X axis direction. In other words, the liquid ejecting head 510 has the pressure chambers 12, and the pressure chambers 12 are arranged in the Y axis direction to form pressure chamber lines. The Y axis direction is an example of a first direction. The X axis direction is an example of a second direction. The pressure chamber line is an example of a pressure chamber group. One of the two pressure chamber lines that is located on the +X direction side may be referred to as a first pressure chamber line and the other of the pressure chamber lines that is located away from the first pressure chamber line in the −X direction of the X axis direction may be referred to a second pressure chamber line. The +X direction side is an example of a first side in the second direction. The −X direction side is an example of a second side in the second direction. FIG. 3 is a plan view of the liquid ejecting head 510 and illustrates the components around the pressure chamber plate 10. In FIG. 3, the protection plate 30 and the casing 40 are not illustrated for ease of explanation.

The pressure chambers 12 of the pressure chamber line are arranged in a straight line in the Y axis direction and arranged at the same position in the X axis direction. The pressure chambers 12 adjacent to each other in the Y axis direction are separated by a partition wall 11 illustrated in FIG. 6. However, the arrangement of the pressure chambers 12 is not limited to this arrangement. For example, the pressure chambers 12 arranged in the Y axis direction may be in a staggered arrangement in which the pressure chambers 12 adjacent to each other in the Y axis direction are arranged at different positions in the X axis direction.

In this embodiment, the pressure chamber 12 is rectangular in which the length in the X axis direction is longer than the length in the Y axis direction in plan view from the +Z direction. However, the shape in plan view of the pressure chamber 12 viewed from the +Z direction is not limited. Examples of the shape include a parallelogram, a polygon, a circle, and an oval. Herein, the oval is a shape having a rectangular base and semicircular portions at the ends in the longitudinal direction. Examples of the oval include a rounded rectangle, an ellipse, and an egg-like shape.

Figure 4:
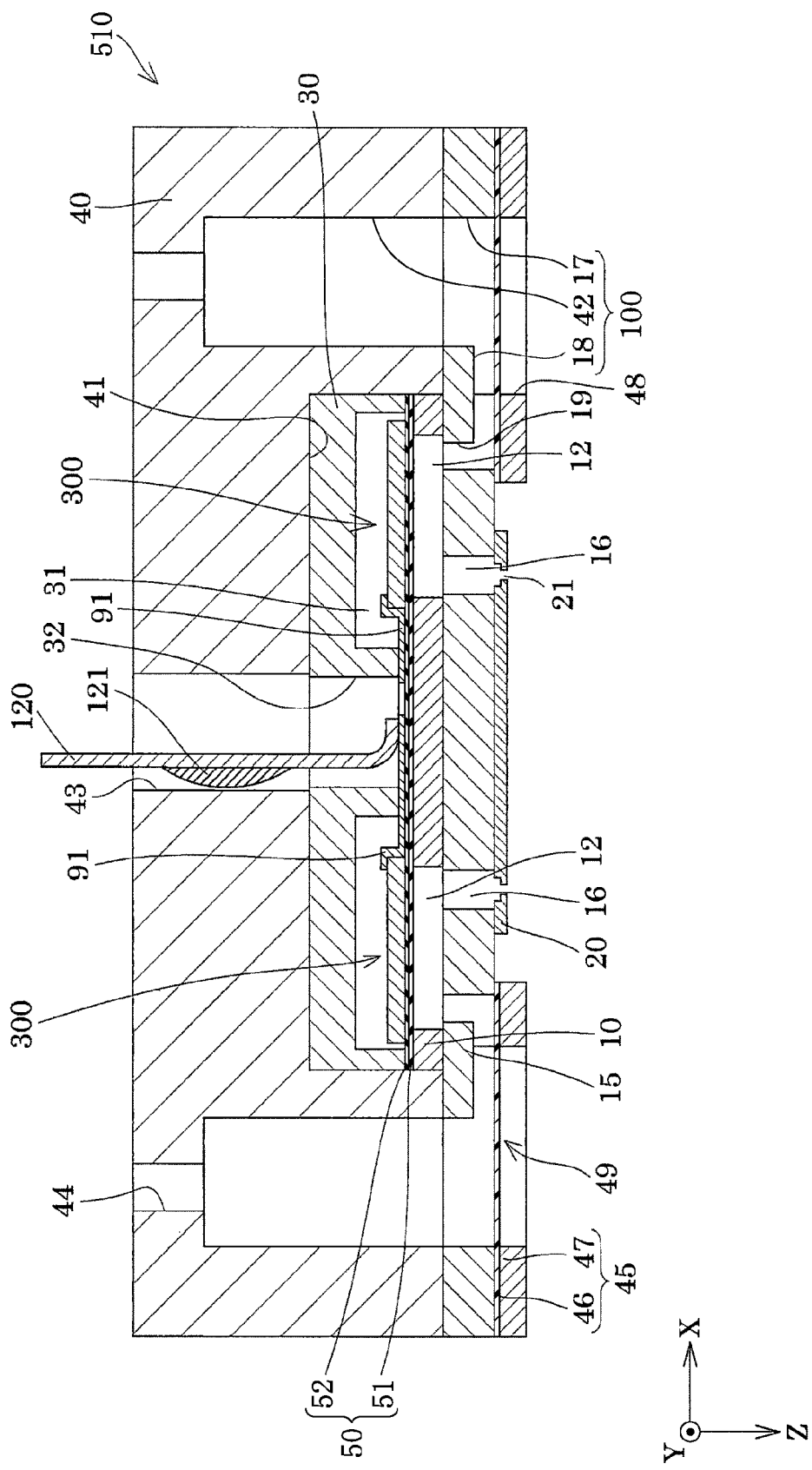
FIG. 4 is a cross-sectional view of the liquid ejecting head taken along line IV-IV in FIG. 3.

As illustrated in FIGS. 2 and 4, the communication plate 15, the nozzle plate 20, and the compliance plate 45 are stacked in order on the +Z direction side of the pressure chamber plate 10.

The communication plate 15 has nozzle communication passages 16 through which the pressure chambers 12 and the nozzles 21 are in communication with each other. The communication plate 15 has first and second manifold portions 17 and 18 that constitute a portion of a manifold 100, which is a common liquid chamber in communication with the pressure chambers 12. The first manifold portion 17 extends through the communication plate 15 in the Z axis direction. The second manifold portion 18 does not extend through the communication plate 15 in the Z axis direction and is a recess in the surface opening in the +Z direction.

The communication plate 15 further has supply communication passages 19 for respective pressure chambers 12. The communication passages 19 are each in communication with one end in the X axis direction of the corresponding pressure chambers 12. The supply communication passage 19 allows communication between the second manifold portion 18 and the pressure chamber 12, enabling ink in the manifold 100 to be supplied to the pressure chamber 12.

The communication plate 15 may be formed of a silicon substrate, a glass substrate, an SOI substrate, any ceramic substrate, and a metal substrate. An example of the metal substrate includes a stainless substrate. The communication plate 15 is preferably formed of a material having substantially the same coefficient of thermal expansion as the material of the pressure chamber plate 10. This reduces warp of the pressure chamber plate 10 and the communication plate 15, which may be caused by a difference in coefficient of thermal expansion, when temperatures of the pressure chamber plate 10 and the communication plate 15 are changed.

The nozzle plate 20 is disposed on a surface of the communication plate 15 away from the pressure chamber plate 10 or a surface facing in the +Z direction. The nozzle plate 20 has nozzles 21 in communication with the pressure chambers 12 through the nozzle communication passages 16.

In this embodiment, the nozzles 21 are arranged in the Y axis direction in lines. The nozzle plate 20 has the nozzles 21 arranged in two nozzle lines away from each other in the X axis direction. The two nozzle lines correspond to the first and second pressure chamber lines. The nozzles 21 in the two nozzle lines are located at the same positions in the X direction. The arrangement of the nozzles 21 is not limited to this. For example, the nozzles 21 adjacent to each other in the Y axis direction may be arranged at different positions in the X axis direction.

The nozzle plate 20 may be formed of any material and may be formed of a silicon substrate, a glass substrate, an SOI substrate, any ceramic substrate, and a metal substrate. An example of the metal substrate includes a stainless substrate. The nozzle plate 20 may be formed of an organic substance, such as a polyimide resin. The nozzle plate 20 is preferably formed of a material having substantially the same coefficient of thermal expansion as the material of the communication plate 15. This reduces warp of the nozzle plate 20 and the communication plate 15, which may be caused by a difference in coefficient of thermal expansion, when temperatures of the nozzle plate 20 and the communication plate 15 are changed.

The compliance plate 45 is disposed on the surface of the communication plate 15 away from the pressure chamber plate 10 or the surface facing in the +Z direction, together with the nozzle plate 20. The compliance plate 45 is disposed to surround the nozzle plate 20 and close the openings of the first manifold 17 and the second manifold 18 in the communication plate 15. In this embodiment, the compliance plate 45 includes a sealing film 46 formed of a flexible thin film and a fixing plate 47 formed of a hard material such as a metal. The fixing plate 47 has an opening 48 extending therethrough in the thickness direction and extending over an area corresponding to the manifold 100. Thus, the manifold 100 has a compliance portion 49 at one side that is sealed only by the flexible sealing film 46.

The vibration plate 50 and the piezoelectric devices 300, which are configured to cause flexural deformation of the vibration plate 50 to apply pressure to ink in the pressure chamber 12, are disposed on top of one another on the surface of the pressure chamber plate 10 away from the nozzle plate 20 or the surface facing in the −Z direction (described in detail later). Specifically described, the vibration plate 50 is disposed on the +Z direction side in the Z axis direction of the piezoelectric device 300 and the pressure chamber plate 10 is disposed on the +Z direction side in the Z axis direction of the vibration plate 50. The Z axis direction is an example of a stacking direction. The +Z direction side is an example of a first side in the stacking direction. The −Z direction side is an example of a second side in the stacking direction. FIG. 4 is a view for explaining the overall structure of the liquid ejecting head 510 and illustrates the simplified structure of the piezoelectric device 300.

The protection plate 30 having substantially the same size as the pressure chamber plate 10 is also attached to the surface of the pressure chamber plate 10 facing in the −Z direction by an adhesive, for example. The protection plate 30 has holders 31 that are spaces for protecting the piezoelectric devices 300. The holder 31 is provided for each of the lines of the piezoelectric devices 300 arranged in the Y axis direction. Two holders 31 are arranged in the X axis direction. Furthermore, the protection plate 30 has a through hole 32 extending therethrough in the Z axis direction between the holders 31, which are arranged in the X axis direction.

The casing 40 is fixed to the protection plate 30. The casing 40 defines the manifold 100, which is in communication with the pressure chambers 12, together with the pressure chamber plate 10. The casing 40 has substantially the same shape as the above-described communication plate 15 in plan view from the −Z direction. The casing 40 is attached to the protection plate 30 and the above-described communication plate 15.

The casing 40 has a housing 41 that is a space having a depth enough to house the pressure chamber plate 10 and the protection plate 30 at a side adjacent to the protection plate 30. The housing 41 has an opening area larger than the area of the protection plate 30 attached to the pressure chamber plate 10. The opening of the housing 41 adjacent to the nozzle plate 20 is sealed by the communication plate 15 with the pressure chamber plate 10 and the protection plate 30 being housed in the housing 41.

The casing 40 has third manifolds 42 at positions away from the housing 41 in the X axis direction. The first and second manifolds 17 and 18 in the communication plate 15 and the third manifold 42 constitute the manifold 100 of this embodiment. The manifold 100 extends continuously in the Y axis direction. The supply communication passages 19, which allow communication between the pressure chambers 12 and the manifold 100, are arranged in the Y axis direction.

The casing 40 has supply openings 44 that are in communication with the manifolds 100 to supply ink to the manifolds 100. The casing 40 further has a coupling opening 43 that is in communication with the through hole 32 in the protection plate 30. The wiring board 120 is disposed in the coupling opening 43.

In the above-described liquid ejecting head 510 of this embodiment, ink is introduced through the supply opening 44 that is coupled to the ink tank 550 through the tube 552 to fill the inside of the liquid ejecting head 510 from the manifold 100 to the nozzle 21. Then, the head circuit 121 applies a voltage in response to the drive signal to the piezoelectric devices 300 corresponding to the pressure chambers 12. Thus, the vibration plate 50 is subjected to flexural deformation together with the piezoelectric devices 30, increasing the pressures in the pressure chambers 12 and forcing ink droplets to be ejected through the nozzles 21.

Hereinafter, the components on the −Z direction side of the pressure chamber plate 10, such as the vibration plate 50 and the piezoelectric devices 300, will be described in detail. In addition to the vibration plate 50 and the piezoelectric devices 300, the liquid ejecting head 510 includes individual lead electrodes 91, common lead electrodes 92, a measurement lead electrode 93, and the resistance wire 401 on the −Z direction side of the piezoelectric chamber plate 10.

Figure 5:
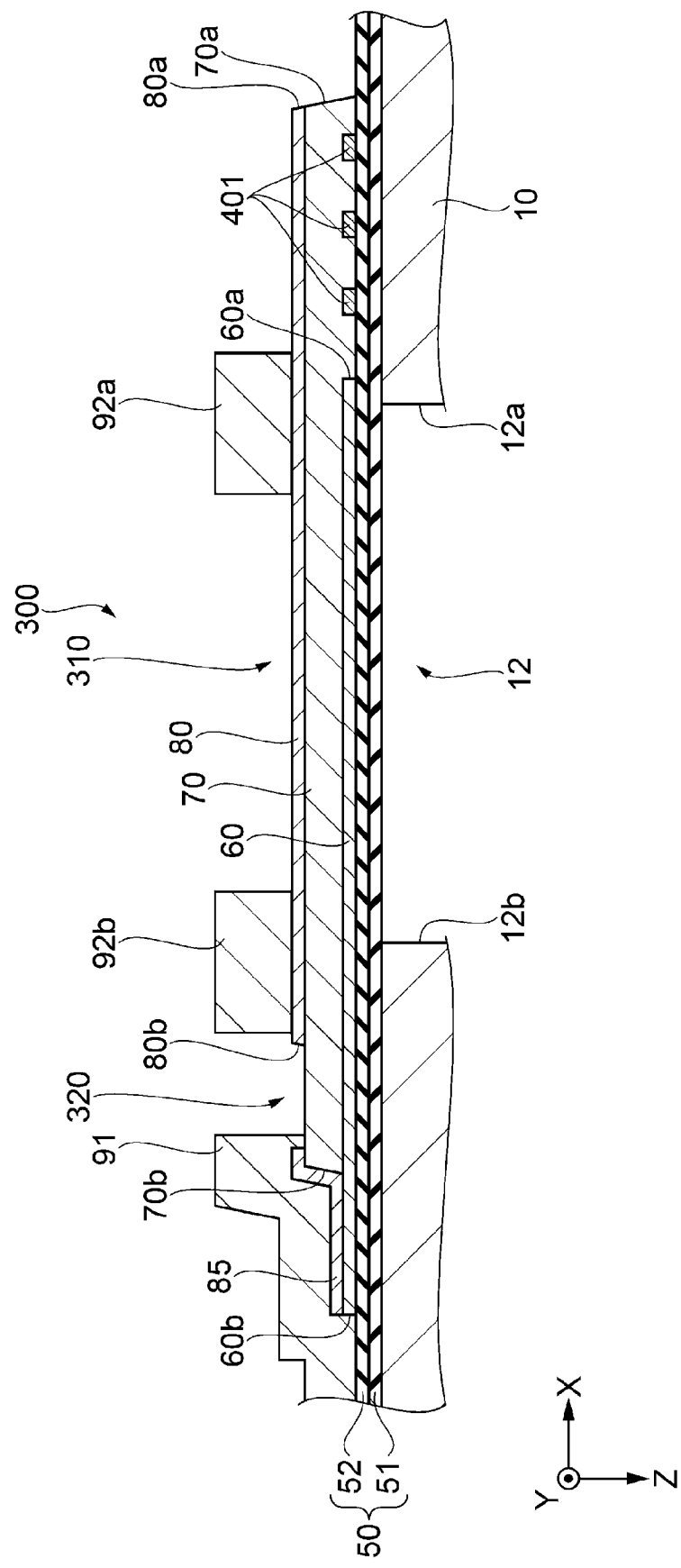
FIG. 5 is a view illustrating main components of the liquid ejecting head illustrated in FIG. 4.
Figure 6:
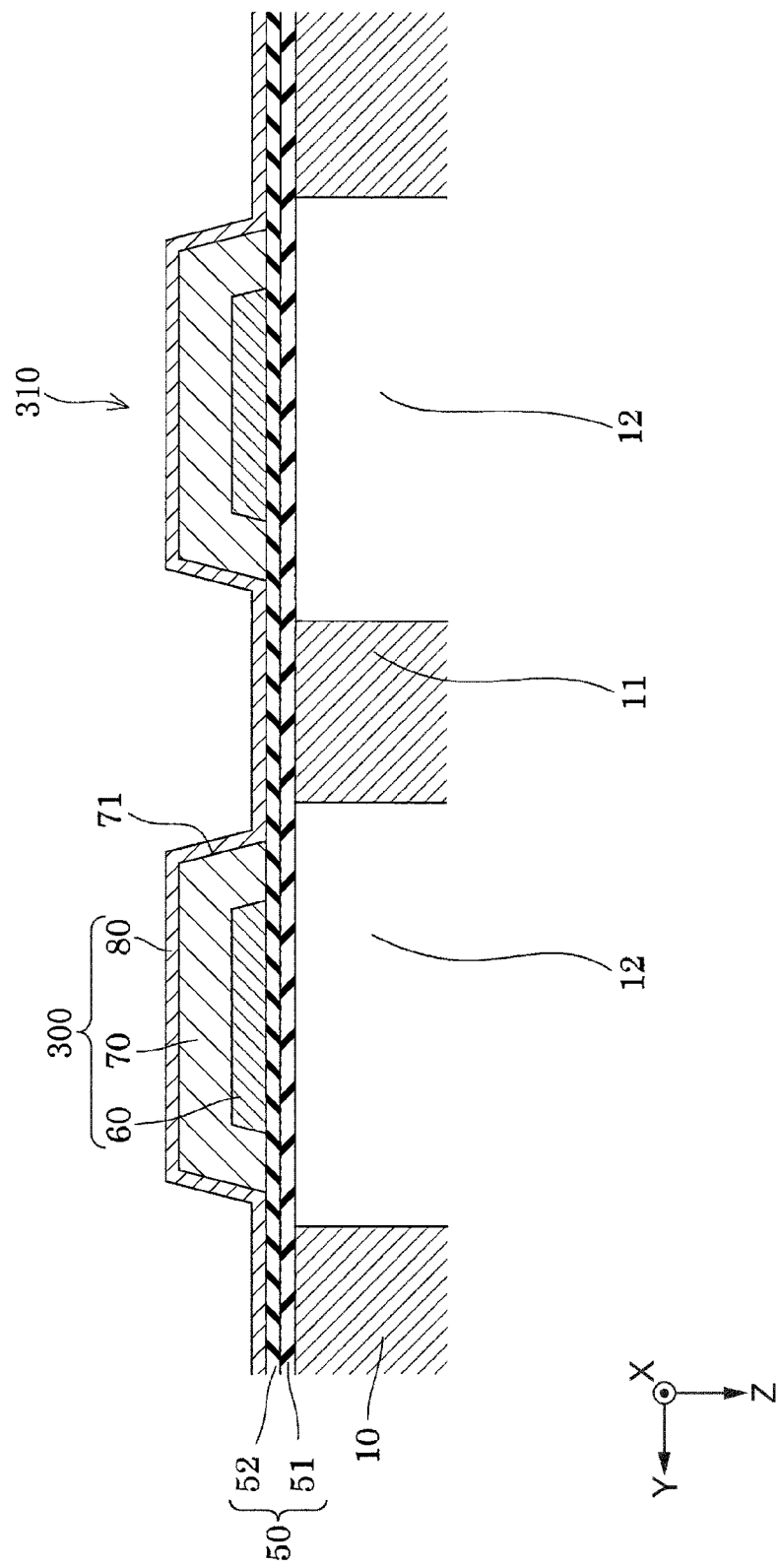
FIG. 6 is a cross-sectional view of the liquid ejecting head taken along line VI-VI in FIG. 3.

As illustrated in FIGS. 4 to 6, the vibration plate 50 includes an elastic film 51 formed of a silicon oxide on the pressure chamber plate 10 and an insulating film 52 formed of a zirconium oxide film on the elastic film 51. The liquid passages such as the pressure chambers 12 are formed by anisotropic etching on the surface of the pressure chamber plate 10 facing in the +Z direction. The elastic film 51 provides the −Z direction side surfaces of liquid passages, such as the pressure chambers 12.

The structure of the vibration plate 50 is not limited to the above. The vibration plate 50 may only include one of the elastic film 51 and the insulating film 52, for example, or may further include a film other than the elastic film 51 and the insulating film 52. The other film may be formed of silicon or silicon nitride, for example.

The piezoelectric device 300 is an example of a piezoelectric actuator that applies a pressure to the ink in the pressure chamber 12. The piezoelectric device 300 includes, in this order from the +Z direction side adjacent to the vibration plate 50 to the −Z direction side, a first electrode 60, a piezoelectric layer 70, and a second electrode 80. In other words, the piezoelectric device 300 includes the first electrode 60, the second electrode 80, and the piezoelectric layer 70, and the piezoelectric layer 70 is located between the first electrode 60 and the second electrode 80 in the Z axis direction in which the first electrode 60, the second electrode 80, and the piezoelectric layer 70 are stacked on top of one another.

The first and second electrodes 60 and 80 are each electrically coupled to the wiring board 120 and configured to apply a voltage to the piezoelectric layer 70 in response to the drive signal supplied from the head circuit 121 mounted on the wiring board 120. A drive voltage that varies depending on the ejection amount of ink is applied to the first electrode 60 and a hold voltage that is constant regardless of the ejection amount of ink is applied to the second electrode 80. The amount of volume change required for the pressure chamber 12 depends on the amount of ink to be ejected. The above-described configuration causes a potential difference between the first electrode 60 and the second electrode 80, resulting in deformation of the piezoelectric layer 70. Specifically described, when the piezoelectric device 300 is driven, the vibration plate 50 is deformed or vibrated and the volume of the pressure chamber 12 is changed. This applies a pressure to the ink in the pressure chamber 12, and thus the ink is ejected from the nozzle 21 through the nozzle communication passage 16.

The piezoelectric device 300 has a portion in which the piezoelectric layer 70 is subjected to piezoelectric strain by application of a voltage between the first electrode 60 and the second electrode 80, and the portion is referred to as an active portion 310. The piezoelectric device 300 further has a portion in which the piezoelectric layer 70 is not subjected to piezoelectric strain, and the portion is referred to as a non-active portion 320. Specifically described, the portion of the piezoelectric device 300 in which the piezoelectric layer 70 is sandwiched between the first electrode 60 and the second electrode 80 is the active portion 310 and the portion in which the piezoelectric layer 70 is not sandwiched between the first electrode 60 and the second electrode 80 is the non-active portion 320. Furthermore, a portion of the piezoelectric device 300 that is actually deformed in the Z axis direction when driven is referred to as a flexible portion and a portion of the piezoelectric device 300 that is not deformed in the Z axis direction is referred to as a non-flexible portion. Specifically described, a portion of the piezoelectric device 300 facing the pressure chamber 12 in the Z axis direction is the flexible portion and a portion located outside the pressure chamber 12 is the non-flexible portion. The active portion 310 may be referred to as an operative portion and the non-active portion 320 may be referred to as a non-operative portion.

Typically, one of the electrodes of the active portion 310 functions as an individual electrode provided for each of the active portions 310 and the other functions as a common electrode shared by the active portions 310. In this embodiment, the first electrode 60 functions as the individual electrode and the second electrode 80 functions as the common electrode.

Specifically described, the first electrode 60 is disposed on the +Z direction side in the Z axis direction of the piezoelectric layer 70 and is divided for the pressure chambers 12 to form the individual electrodes for the respective active portions 310. In other words, the first electrode 60 is provided for each of the pressure chambers 12. The first electrode 60 has a smaller width in the Y axis direction than the pressure chamber 12. The first electrode 60 has the end in the Y axis direction in an area facing the pressure chamber 12.

The first electrode 60 has an end 60a in the +X direction and an end 60b in the −X direction that are located outwardly from the pressure chamber 12. For example, as illustrated in FIG. 5, the end 60a of the first electrode 60 is located away in the +X direction from the end 12a in the +X direction of the pressure chamber 12. The end 60b of the first electrode 60 is located away in the −X direction from the end 12b in the −X direction of the pressure chamber 12.

The first electrode 60 may be formed of any material. For example, the first electrode 60 is formed of an electrically conducting material. Examples of the electrically conducting material include metals such as platinum (Pt), iridium (Ir), gold (Au), and titanium (Ti) and electrically conductive metal oxides such as indium tin oxide (ITO). Alternatively, the first electrode 60 may be formed of layers of multiple materials such as platinum (Pt), iridium (Ir), gold (Au), and titanium (Ti). In this embodiment, the first electrode 60 is formed of platinum (Pt).

As illustrated in FIG. 3, the piezoelectric layer 70 having a predetermined length in the X axis direction extends continuously in the Y axis direction. The piezoelectric layer 70 having a predetermined thickness extends continuously in an arrangement direction in which the pressure chambers 12 are arranged. The thickness of the piezoelectric layer 70 is not limited and may be within a range of about 1000 to 4000 nanometers.

As illustrated in FIG. 5, the length in the X axis direction of the piezoelectric layer 70 is longer than the length in the X axis direction or the longitudinal direction of the pressure chamber 12. The piezoelectric layer 70 extends beyond the ends in the X axis direction of the pressure chamber 12. This configuration in which the piezoelectric layer 70 extends beyond the ends in the X axis direction of the pressure chamber 12 improves the strength of the vibration plate 50. Thus, damage such as crack is less likely to occur in the vibration plate 50 and in the piezoelectric device 300 when the active portion 310 is driven to deform the piezoelectric device 300.

Furthermore, for example, as illustrated in FIG. 5, in the first pressure chamber line, the end 70a in the +X direction of the piezoelectric layer 70 is located outwardly in the +X direction from the end 60a of the first electrode 60. The piezoelectric layer 70 covers the end 60a of the first electrode 60. In contrast, the end 70b in the −X direction of the piezoelectric layer 70 is located inwardly in the +X direction from the end 60b of the first electrode 60. The piezoelectric layer 70 does not cover the end 60b of the first electrode 60.

As illustrated in FIGS. 3 and 6, the piezoelectric layer 70 has grooves 71, which are thin portions having a smaller thickness than the other portion, at positions corresponding to the partition walls 11. In this embodiment, portions of the piezoelectric layer 70 that have been entirely removed in the Z axis direction are the grooves 71. As can be understood from the above, a thin portion of the piezoelectric layer 70, which has a smaller thickness than the other portion, may be an empty area of the piezoelectric layer 70 that has been entirely removed in the Z axis direction. However, the groove 71 may have the piezoelectric layer 70 having a smaller thickness on the bottom.

The length in the Y axis direction of the groove 71 or the width of the groove 71 is substantially the same or larger than the width of the partition wall 11. In this embodiment, the groove 71 is wider than the partition wall 11.

The groove 71 has a rectangular shape in plan view from the −Z direction side. The shape of the groove 71 in plan view from the −Z direction is not limited to a rectangular shape and may be a polygon having five or more sides or may be a circle or an oval, for example.

The grooves 71 in the piezoelectric layer 70 reduce the strength of portions of the vibration plate 50 facing the ends in the Y axis direction of the pressure chambers 12, i.e., the arm portions of the vibration plate 50. This results in reliable deformation of the piezoelectric device 300.

The piezoelectric layer 70 may be a perovskite-structure crystal film formed of a ferroelectric ceramic material exhibiting an electromechanical transducing action, namely a perovskite crystal, on the first electrode 60. The piezoelectric layer 70 may be formed of a ferroelectric piezoelectric material, such as lead zirconate titanate (PZT) or a material including the ferroelectric piezoelectric material and a metal oxide, such as niobium oxide, nickel oxide, and magnesium oxide. Specific examples of the material include lead titanate ($PbTiO_3$), lead zirconate titanate ($Pb(Zr, Ti)O_3$), lead zirconate ($PbZrO_3$), lead lanthanum titanate ($(Pb, La), TiO_3$), lead lanthanum zirconate titanate ($(Pb, La) (Zr, Ti)O_3$), lead zirconate titanate magnesium niobate ($Pb(Zr, Ti) (Mg, Nb)O_3$). In this embodiment, the piezoelectric layer 70 is formed of lead zirconate titanate (PZT).

The material of the piezoelectric layer 70 is not limited to a lead-based piezoelectric material including lead. The piezoelectric layer 70 may be formed of a non-lead-based piezoelectric material not including lead. Examples of the non-lead-based piezoelectric material include bismuth ferrate (($BiFeO_3$), abbreviated as "BFO"), barium titanate (($BaTiO_3$), abbreviated as "BT"), sodium potassium niobate ((K, Na) ($NbO_3$), abbreviated as "KNN"), lithium sodium potassium niobate ((K, Na, Li) ($NbO_3$)), lithium sodium potassium tantalate niobate ((K, Na, Li) (Nb, Ta)$O_3$), bismuth potassium titanate (($Bi½K½)TiO_3$, abbreviated as "BKT"), sodium bismuth titanate (($Bi½Na½)TiO_3$, abbreviated as "BNT"), bismuth manganate ($BiMnO_3$, abbreviated as BM), a composite oxide including bismuth, potassium, titanium, and iron and having a perovskite structure (x[(BixK1−x)$TiO_3$]−(1−x) [$BiFeO_3$], abbreviated as "BKT-BF"), a composite oxide including bismuth, iron, barium, and titanium and having a perovskite structure ((1−x) [$BiFeO_3$]−x[$BaTiO_3$], abbreviated as "BFO-BT"), and a material including the composite oxide and a metal such as manganese, cobalt, and chromium ((1−x) [Bi(Fe1−yMy)$O_3$]−x[$BaTiO_3$] (M represents Mn, Co, or Cr)).

As illustrated in FIGS. 3, 5, and 6, the second electrode 80 is disposed on the −Z direction side in the Z axis direction of the piezoelectric layer 70, which is the side away from the first electrode 60. The second electrode 80 is the common electrode shared by the multiple active portions 310. In other words, the second electrode 80 is shared by the pressure chambers 12. The second electrode 80 having a predetermined length in the X axis direction extends continuously in the Y axis direction. The second electrode 80 extends along the inner surface of the groove 71, i.e., along the side surfaces of the groove 71 of the piezoelectric layer 70 and a portion of the insulating film 52, which is the bottom surface of the groove 71. The groove 71 may have the second electrode 80 only partly over the inner surface and does not have to have the second electrode 80 over the entire inner surface.

Furthermore, for example, as illustrated in FIG. 5, in the first pressure chamber line, the end 80a in the +X direction of the second electrode 80 is located outwardly in the +X direction from the end 60a of the first electrode 60 covered by the piezoelectric layer 70. The end 80a of the second electrode 80 is located outwardly in the +X direction from the end 60a of the first electrode 60 beyond the end 12a of the pressure chamber 12 in the +X direction. In this embodiment, the end 80a of the second electrode 80 and the end 70a of the piezoelectric layer 70 are located at substantially the same position in the X axis direction. The end in the +X direction of the active portion 310 or the border between the active portion 310 and the non-active portion 320 is defined by the end 60a of the first electrode 60.

In contrast, the end 80b in the −X direction of the second electrode 80 is located outwardly in the −X direction from the end 12b in the −X direction of the pressure chamber 12 and is located inwardly in the +X direction from the end 70b of the piezoelectric layer 70. As described above, the end 70b of the piezoelectric layer 70 is located inwardly in the +X direction from the end 60b of the first electrode 60. Thus, the end 80b of the second electrode 80 is disposed on a portion of the piezoelectric layer 70 that is away from the end 60b of the first electrode 60 in the +X direction. In this configuration, the piezoelectric layer 70 has an exposed portion adjacent to the end 80b of the second electrode 80 in the −X direction.

As described above, the end 80b of the second electrode 80 is away from the end 70b of the piezoelectric layer 70 and the end 60b of the first electrode 60 in the +X direction. Thus, the end 80b of the second electrode 80 defines the end in the −X direction of the active portion 310 or the border between the active portion 310 and the non-active portion 320.

The second electrode 80 may be formed of any material. As the first electrode 60, the second electrode 80 is formed of an electrically conducting material, for example. Examples of the electrically conducing material include metals such as platinum (Pt), iridium (Ir), gold (Au), and titanium (Ti) and electrically conductive metal oxides such as indium tin oxide (ITO). Alternatively, the second electrode 80 may be formed of layers of multiple materials such as platinum (Pt), iridium (Ir), gold (Au), and titanium (Ti). In this embodiment, the second electrode 80 is formed of iridium (Ir).

Furthermore, a wiring portion 85 is disposed outwardly from the end 80b of the second electrode 80, i.e., is disposed away in the −X direction from the end 80b of the second electrode 80. The wiring portion 85 is in the same layer as the second electrode 80 but electrically discontinuous from the second electrode 80. The wiring portion 85 is spaced apart from the end 80b of the second electrode 80 and is disposed on a portion of the first electrode 60 extending in the −X direction from the piezoelectric layer 70. The wiring portion 85 is provided for each of the active portions 310. In other words, multiple wiring portions 85 are arranged in the Y axis direction at a predetermined interval. The wiring portion 85 may be in a different layer from the second electrode 80. However, the wiring portion 85 is preferably in the same layer as the second electrode 80. This simplifies the process of manufacturing the wiring portion 85 and reduces the cost.

Of the first electrode 60 and the second electrode 80 included in the piezoelectric device 300, the first electrode 60 is electrically coupled to the individual lead electrode 91, and the second electrode 80 is electrically coupled to the common lead electrode 92, which is a common drive electrode. The individual lead electrode 91 is an example of a first wire. The common lead electrode 92 is an example of a second wire. The individual lead electrode 91 and the common lead electrode 92 are each electrically coupled to the flexible wiring board 120 at the end opposite the end coupled to the piezoelectric device 300. The wiring board 120 includes multiple wires for connection to the controller 580 and a power supply circuit (not illustrated). In this embodiment, the wiring board 120 may be a flexible printed circuit (FPC). Instead of FPC, the wiring board 120 may be any flexible board such as a flexible flat cable (FFC).

In this embodiment, the individual lead electrodes 91 and the common lead electrode 92 each have a portion exposed in the through hole 32 in the protection plate 30 and electrically coupled to the wiring board 120 in the through hole 32. The wiring board 120 has the head circuit 121 having a switching device for driving the piezoelectric device 300.

In this embodiment, the individual lead electrode 91 and the common lead electrode 92 are in the same layer but electrically discontinuous from each other. This configuration requires a simpler manufacturing process and a lower cost than a configuration in which the individual lead electrode 91 and the common lead electrode 92 are separately formed. However, the individual lead electrode 91 and the common lead electrode 92 may be in different layers.

The individual lead electrode 91 and the common lead electrode 92 may be formed of any conductive material. Examples of the material include gold (Au), copper (Cu), titanium (Ti), tungsten (W), nickel (Ni), chromium (Cr), platinum (Pt), and aluminum (Al). In this embodiment, the individual lead electrode 91 and the common lead electrode 92 are formed of gold (Au). The individual lead electrode 91 and the common lead electrode 92 may have an adhesion layer to increase adhesion to the first electrode 60, the second electrode 80, and the vibration plate 50.

The individual lead electrode 91 is provided for each of the active portions 310 or each of the first electrodes 60. As illustrated in FIG. 5, in the first pressure chamber line, for example, the individual lead electrode 91 is coupled to a portion of the first electrode 60 near the end 60b that is located outwardly from the piezoelectric layer 70 with the wiring portion 85 therebetween. The individual lead electrode 91 extends in the −X direction to the pressure chamber plate 10, practically to the vibration plate 50.

In contrast, as illustrated in FIG. 3, in the first pressure chamber line, for example, the common lead electrode 92 extends, at the ends in the Y axis direction, in the −X direction from the second electrode 80, which functions as the common electrode on the piezoelectric layer 70, to the vibration plate 50. Furthermore, the common lead electrode 92 has an elongated portion 92a and an elongated portion 92b. As illustrated in FIGS. 3 and 5, in the first pressure chamber line, for example, the elongated portion 92a extends in the Y axis direction along the ends 12a of the pressure chambers 12, and the elongated portion 92b extends in the Y axis direction along the ends 12b of the pressure chambers 12. The elongated portions 92a and 92b extend continuously in the Y axis direction for the active portions 310.

Furthermore, the elongated portions 92a and 92b each extend in the X axis direction from the inside of the pressure chamber 12 to the outside of the pressure chamber 12. In this embodiment, the active portion 310 of the piezoelectric device 300 extends in the X axis direction beyond the ends of the pressure chamber 12. The elongated portions 92a and 92b on the active portion 310 extend to the outside of the pressure chamber 12.

As illustrated in FIG. 5, the resistance wire 401 (a first resistance wire) is disposed on the surface of the vibration plate 50 facing in the −Z direction. The resistance wire 401 is an example of a temperature detector for measuring temperature in the pressure chamber 12. The temperature detector in this embodiment uses properties that the electrical resistance values of metals and semiconductors change with temperature. The resistance wire 401 may be formed of any material whose electrical resistance value is dependent on temperature. Examples of the material include gold (Au), platinum (Pt), iridium (Ir), aluminum (Al), copper (Cu), titanium (Ti), tungsten (W), nickel (Ni), and chromium (Cr). Preferably, the resistance wire 401 is formed of platinum (Pt) because the resistance value of platinum is highly variable with temperature and the platinum is stable and sensitive. The electrical resistance value is an example of a measurement value obtained by the temperature detector. In this embodiment, the resistance wire 401 is in the same layer as the first electrode 60 on the surface of the vibration plate 50 facing in the −Z direction and is electrically discontinuous from the first electrode 60. Thus, the resistance wire 401 is formed of the same material of platinum (Pt) as the first electrode 60. This requires a simpler manufacturing process and a lower cost than a configuration in which the resistance wire 401 and the first electrode 60 are formed separately. However, the resistance wire 401 and the first electrode 60 may be in different layers.

As illustrated in FIG. 3, the resistance wire 401 is continuous and is coupled to a measurement lead electrode 93a at the end in the +X direction of the X axis direction and is coupled to a measurement lead electrode 93b at the other end in the −X direction of the X axis direction. Thus, the resistance wire 401 is electrically coupled to the wiring board 120, enabling the controller 580 to determine the electrical resistance value of the resistance wire 401. The measurement lead electrode 93 including the measurement lead electrode 93a and the measurement lead electrode 93b is an example of a coupler through which the resistance wire 401 is coupled to the wiring board 120. In this embodiment, the resistance wire 401 is covered by the piezoelectric layer 70 and is located between the vibration plate 50 and the piezoelectric layer 70 in the Z axis direction.

The resistance wire 401 has a portion extending in a first-pressure-chamber-line-side meandering pattern at the +X direction side in the X axis direction and a portion extending in a second-pressure-chamber-line-side meandering pattern at the −X direction side in the X axis direction. The first-pressure-chamber-line-side meandering pattern meanders, when viewed from the −Z direction, in the Y axis direction over the supply communication passage 19 in communication with the pressure chambers 12 of the first pressure chamber line. The second-pressure-chamber-line-side meandering pattern meanders, when viewed from the −Z direction, in the Y axis direction over the supply communication passage 19 in communication with the pressure chambers 12 of the second pressure chamber line. In other words, the resistance wire 401 is arranged in the first-pressure-chamber-line-side meandering pattern for the first pressure chamber line composed of the pressure chambers 12 and in the second-pressure-chamber-line-side meandering pattern for the second pressure chamber line composed of the pressure chambers 12. Furthermore, as illustrated in FIGS. 4 and 5, a distance in the Z axis direction between the end in the −Z direction of the pressure chamber 12 and the resistance wire 401 is shorter than the dimension in the Z axis direction of the pressure chamber 12. Furthermore, for example, in the first pressure chamber line, the maximum distance in the X axis direction between the end 12a in the +X direction of the pressure chamber 12 and the resistance wire 401 is shorter than the dimension in the X axis direction of the pressure chamber 12. In this configuration, the electrical resistance value of the resistance wire 401 readily changes with a change in temperature in the pressure chamber 12.

In this embodiment, the measurement lead electrode 93 including the measurement lead electrodes 93a and 93b is in the same layer as the individual lead electrode 91 and the common lead electrode 92 but is electrically discontinuous from the individual lead electrode 91 and the common lead electrode 92. This configuration requires a simpler manufacturing process and a lower cost than a configuration in which the measurement lead electrode 93 is formed separately from the individual lead electrode 91 and the common lead electrode 92. However, the measurement lead electrode 93 may be in a different layer from the individual lead electrode 91 and the common lead electrode 92.

The measurement lead electrode 93 may be formed of any conductive material. Examples of the material include gold (Au), copper (Cu), titanium (Ti), tungsten (W), nickel (Ni), chromium (Cr), platinum (Pt), and aluminum (Al). In this embodiment, the measurement lead electrode 93 is formed of gold (Au). The measurement lead electrode 93 is formed of the same material as the individual lead electrode 91 and the common lead electrode 92. The measurement lead electrode 93 may have an adhesion layer to increase adhesion to the resistance wire 401 and the vibration plate 50.

In this embodiment, the measurement lead electrode 93 has a portion exposed in the through hole 32 in the protection plate 30 and electrically coupled to the wiring board 120 in the through hole 32. This enables the controller 580 to obtain the electrical resistance value of the resistance wire 401 through the wiring board 120. In this embodiment, the controller 580 has data about a corresponding relationship between the electrical resistance values of the resistance wire 401 and temperatures. Before the controller 580 drives the piezoelectric device 300, the controller 580 measures the electrical resistance value of the resistance wire 401 and determines the temperature in the pressure chamber 12 with reference to the corresponding relationship between the electrical resistance values of the resistance wire 401 and temperatures.

For example, if the temperature detector is located outside the liquid ejecting head 510, a difference between the temperature measured by the temperature detector and the temperature in the pressure chamber 12 may be larger than a difference between the temperature in the liquid ejecting head 510 and the temperature in the pressure chamber 12. In such a case, the liquid ejecting apparatus 500 is unlikely to perform ejection control of the liquid ejecting head 510 appropriate for the temperature of ink in the pressure chamber 12. In this embodiment, the resistance wire 401 is disposed on the vibration plate 50, which is a component of the liquid ejecting head 510. In other words, the resistance wire 401 is in the liquid ejecting head 510. In this configuration, the liquid ejecting head 510 includes the resistance wire 401, and thus a difference between the temperature determined by using the electrical resistance value of the resistance wire 401 and the temperature in the pressure chamber 12 is smaller than that in a configuration in which the temperature outside the liquid ejecting head 510 is measured. Furthermore, in this configuration, the liquid ejecting apparatus 500 is likely to readily perform the ejection control of the liquid ejecting head 510 appropriate for the temperature of ink in the pressure chamber 12.

As described above, the liquid ejecting head 510 according to the first embodiment and the liquid ejecting apparatus 500 according to the first embodiment achieve the following advantages.

The liquid ejecting head 510 includes the piezoelectric device 300 including the first electrode 60, the second electrode 80, and the piezoelectric layer 70 located between the first electrode 60 and the second electrode 80 in the Z axis direction in which the first electrode 60, the second electrode 80, and the piezoelectric layer 70 are stacked on top of one another, the vibration plate 50 disposed on the +Z direction side in the Z axis direction of the piezoelectric device 300, the pressure chamber plate 10 disposed on the +Z direction side in the Z axis direction of the vibration plate 50 and including the pressure chambers 12 whose volume is changed by deformation of the vibration plate 50 when the piezoelectric device 300 is driven, the wiring board 120, the individual lead electrode 91 through which the wiring board 120 and the first electrode 60 are electrically coupled to each other, the common lead electrode 92 through which the wiring board 120 and the second electrode 80 are electrically coupled to each other, and the resistance wire 401 electrically coupled to the wiring board 120 and used to determine a temperature in the pressure chambers 12. In this configuration in which the liquid ejecting head 510 includes the resistance wire 401, a difference between the temperature determined by using the measurement value obtained by the resistance wire 401 and the temperature in the pressure chamber 12 is smaller than that in a configuration in which the temperature is measured outside the liquid ejecting head 510.

The resistance wire 401 is formed of the same material as the first electrode 60. In this configuration, the resistance wire 401 is readily formed in the same step as the first electrode 60.

The first electrode 60 is provided for each of the pressure chambers 12 arranged in the Y axis direction. The second electrode 80 is shared by the pressure chambers 12. The first electrode 60 is disposed on the −Z direction side in the Z axis direction of the piezoelectric layer 70. The second electrode 80 is disposed on the −Z direction side in the Z axis direction of the piezoelectric layer 70. In this configuration, the piezoelectric device 300 is readily driven appropriately for the required ejection amount of ink.

The wiring board 120 includes the head circuit 121, and the head circuit 121 is configured to apply a drive voltage that varies depending on the ejection amount of ink to the first electrode 60 through the individual lead electrode 91 and configured to apply a hold voltage that is constant regardless of the ejection amount of ink to the second electrode 80 through the common lead electrode 92. In this configuration, the piezoelectric device 300 is readily driven appropriately for the required ejection amount of ink.

The individual lead electrodes 91 are disposed between the common lead electrode 92 and the measurement lead electrode 93 in the Y axis direction. In this configuration, the first electrodes 60, the second electrode 80, and the resistance wire 401 are efficiently coupled to the wiring board 120.

The liquid ejecting apparatus 500 includes the liquid ejecting head 510 and the controller 580 configured to control ejection of ink from the liquid ejecting head 510. In this configuration, ejection from the liquid ejecting head 510 is readily controlled.

2. Second Embodiment

Next, a resistance wire 451 included in a liquid ejecting head 510 of a second embodiment, which is an embodiment of the present disclosure, will be described. The components identical to those of the liquid ejecting head 510 in the first embodiment are assigned the same reference numerals as those in the first embodiment without duplicated explanation.

Figure 7:
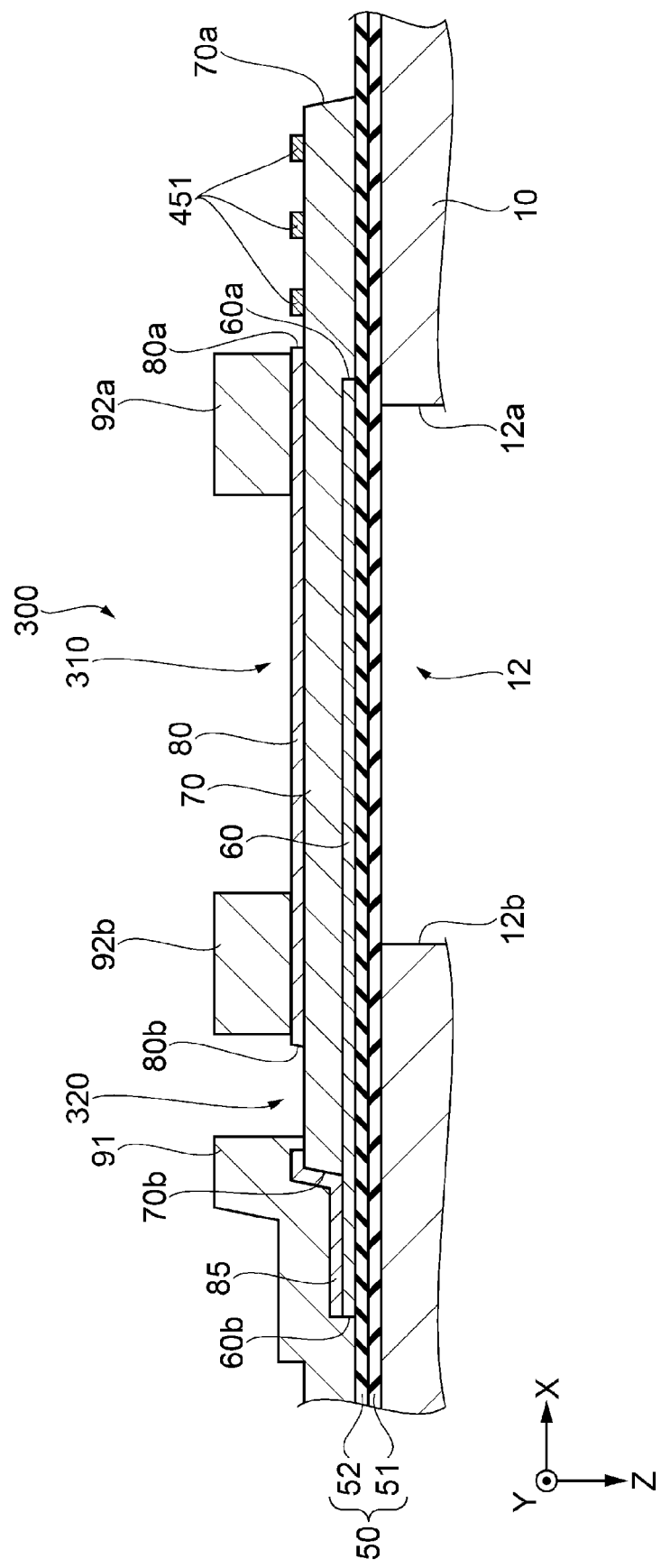
FIG. 7 is a detailed view illustrating main components of a liquid ejecting head according to a second embodiment.

The resistance wire 401 in the first embodiment is in the same layer as the first electrode 60 and is electrically discontinuous from the first electrode 60 on the surface of the vibration plate 50 facing in the −Z direction. In contrast, as illustrated in FIG. 7, the resistance wire 451 in this embodiment is disposed on the surface of the piezoelectric layer 70 facing in the −Z direction. The resistance wire 451 is an example of a temperature detector for measuring temperature in the pressure chamber 12. The resistance wire 451 may be formed of any material whose electrical resistance value is dependent on temperature. Examples of the material include gold (Au), platinum (Pt), iridium (Ir), aluminum (Al), copper (Cu), titanium (Ti), tungsten (W), nickel (Ni), and chromium (Cr). In this embodiment, the resistance wire 451 is in the same layer as the second electrode 80 and is electrically discontinuous from the second electrode 80 on the surface of the piezoelectric layer 70 facing in the −Z direction. Thus, the resistance wire 451 is formed of iridium (Ir) as the second electrode 80. This requires a simpler manufacturing process and a lower cost than a configuration in which the resistance wire 451 is formed separately from the second electrode 80. However, the resistance wire 451 and the second electrode 80 may be in different layers.

As described above, in the liquid ejecting head 510 according to the second embodiment, the resistance wire 451 is formed of the same material as the second electrode 80. In this configuration, the resistance wire 451 is readily formed in the same step as the second electrode 80.

3. Third Embodiment

Next, a resistance wire 461 included in a liquid ejecting head 510 of a third embodiment, which is an embodiment of the present disclosure, will be described. The components identical to those of the liquid ejecting head 510 in the first embodiment are assigned the same reference numerals as those in the first embodiment without duplicated explanation.

Figure 8:
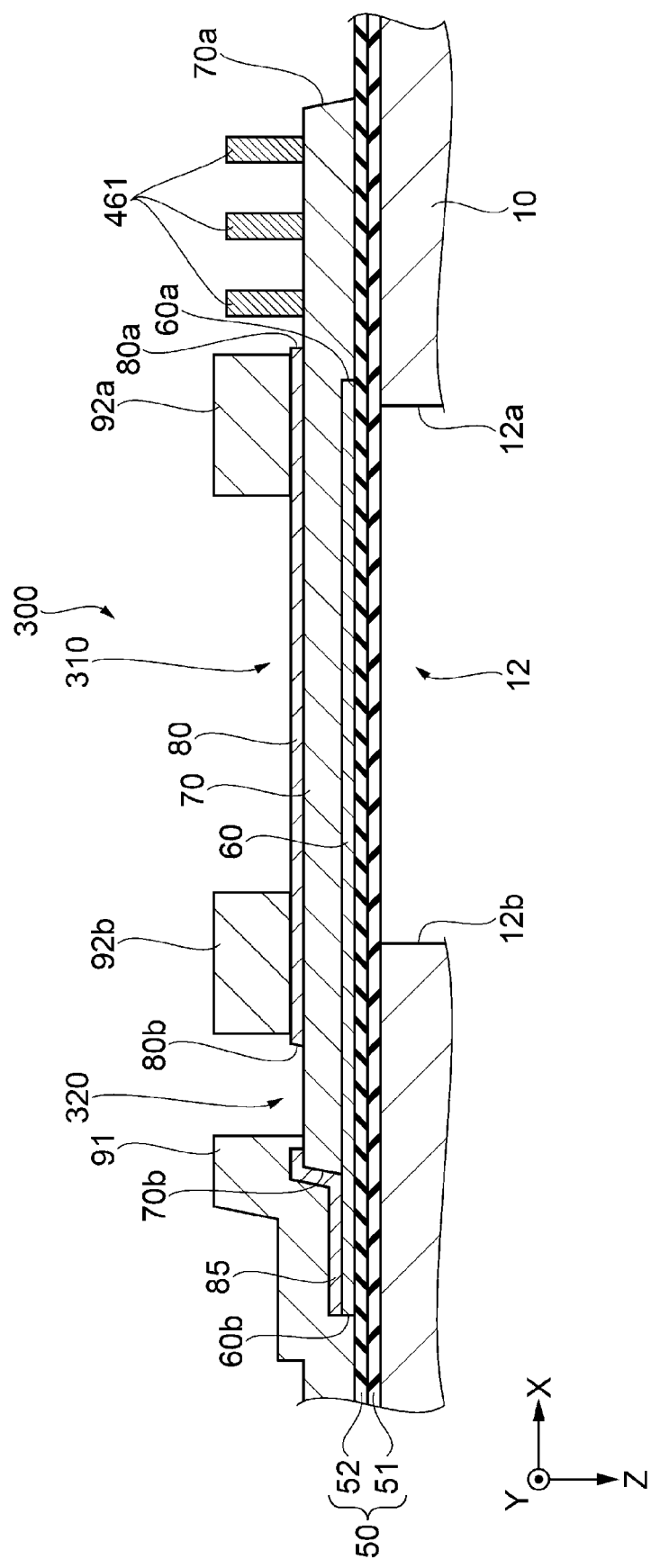
FIG. 8 is a detailed view illustrating main components of a liquid ejecting head according to a third embodiment.

The resistance wire 401 in the first embodiment is in the same layer as the first electrode 60 and is electrically discontinuous from the first electrode 60 on the surface of the vibration plate 50 facing in the −Z direction. In contrast, as illustrated in FIG. 8, the resistance wire 461 in this embodiment is disposed on the surface of the piezoelectric layer 70 facing in the −Z direction. The resistance wire 461 is an example of a temperature detector for measuring temperature in the pressure chamber 12. The resistance wire 461 may be formed of any material whose electrical resistance value is dependent on temperature. Examples of the material include gold (Au), platinum (Pt), iridium (Ir), aluminum (Al), copper (Cu), titanium (Ti), tungsten (W), nickel (Ni), and chromium (Cr).

In this embodiment, the resistance wire 461 is in the same layer as the measurement lead electrode 93 including the measurement lead electrodes 93a and 93b and is electrically continuous from the measurement lead electrode 93 on the surface of the piezoelectric layer 70 facing in the −Z direction. In other words, the resistance wire 461 is the same wire as the measurement lead electrode 93. In this configuration, the resistance wire 461 in this embodiment is in the same layer as the individual lead electrode 91 and the common lead electrode 92 but is electrically discontinuous from the individual lead electrode 91 and the common lead electrode 92. Thus, the resistance wire 461 is formed of gold (Au) as the individual lead electrode 91 and the common lead electrode 92. This requires a simpler manufacturing process and a lower cost than a configuration in which the resistance wire 461 is formed separately from the individual lead electrode 91 and the common lead electrode 92. However, the resistance wire 461 may be in a different layer from the individual lead electrode 91, the common lead electrode 92, and the measurement lead electrode 93.

As described above, in the liquid ejecting head 510 according to the third embodiment, the resistance wire 461 is formed of the same material as at least one of the individual lead electrode 91 and the common lead electrode 92. In this configuration, the resistance wire 461 is readily formed in the same step as at least one of the individual lead electrode 91 and the common lead electrode 92.

4. Fourth Embodiment

Next, a resistance wire included in a liquid ejecting head 510 of a fourth embodiment, which is an embodiment of the present disclosure, will be described. The components identical to those of the liquid ejecting head 510 in the first embodiment are assigned the same reference numerals as those in the first embodiment without duplicated explanation.

Figure 9:
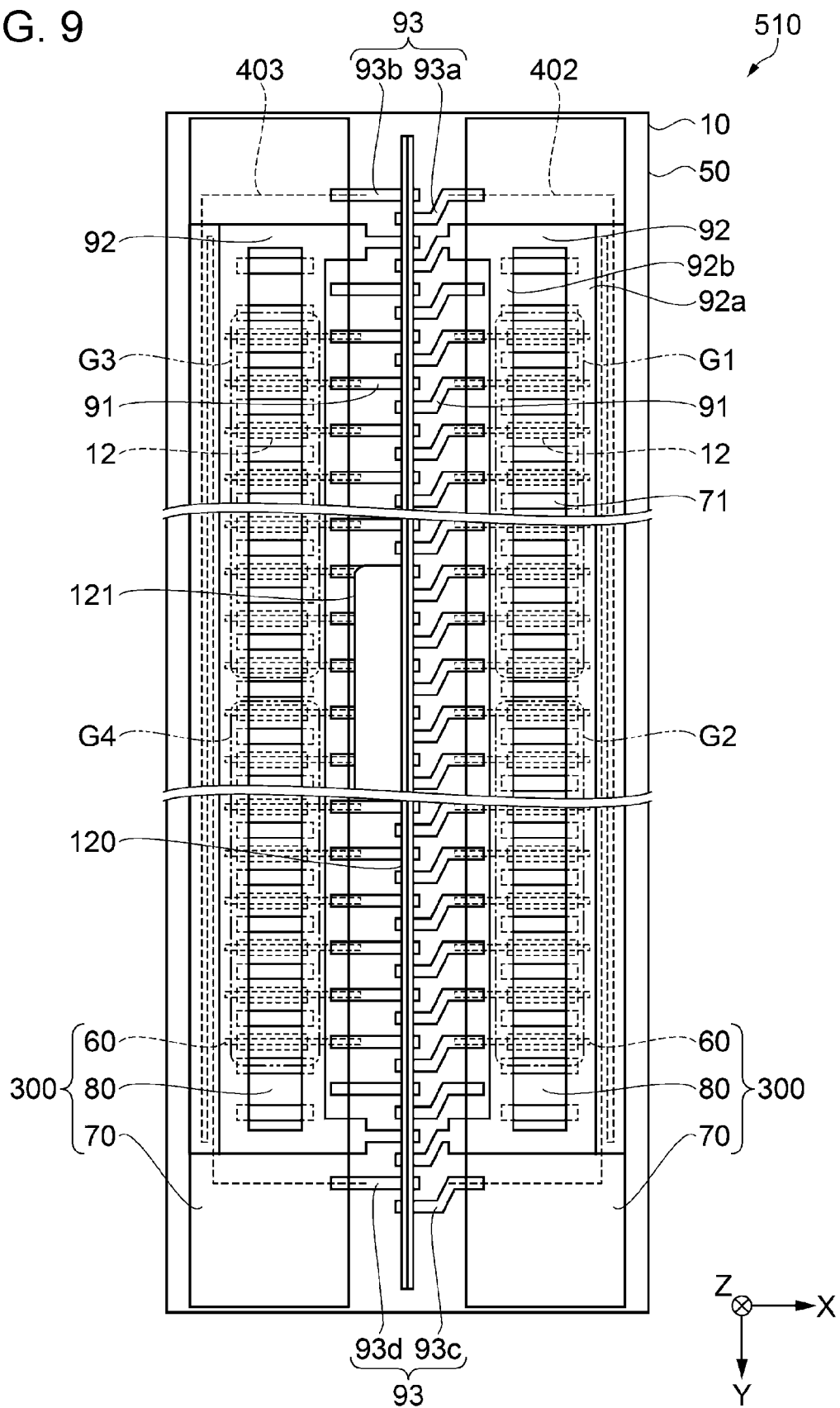
FIG. 9 is a plan view illustrating a liquid ejecting head according to a fourth embodiment.
Figure 10:
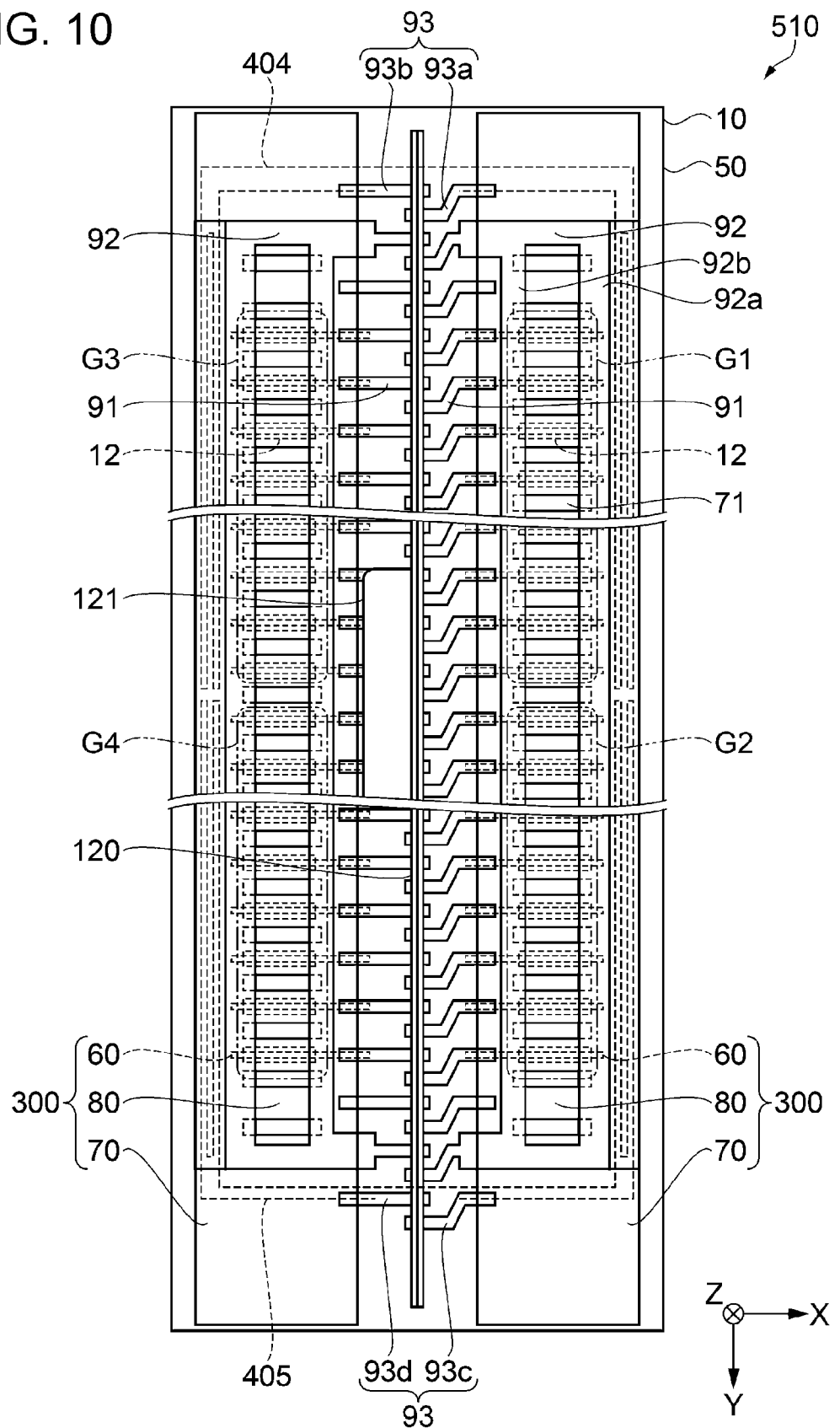
FIG. 10 is a plan view illustrating a modification of the liquid ejecting head according to the fourth embodiment.
Figure 11:
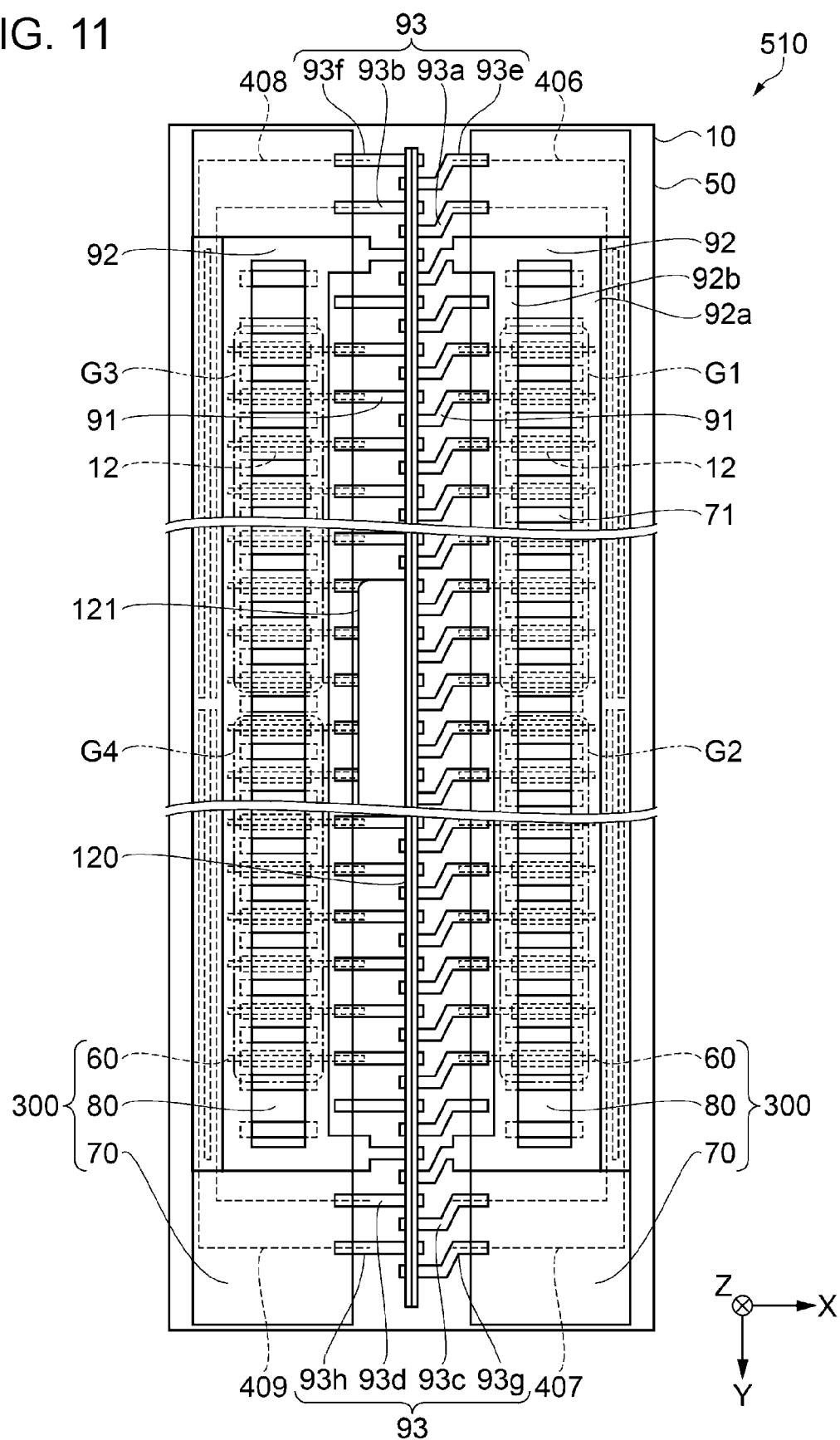
FIG. 11 is a plan view illustrating a modification of the liquid ejecting head according to the fourth embodiment.

The resistance wire 401 in the first embodiment includes a portion extending in the first-pressure-chamber-line-side meandering pattern along the first pressure chamber line of the pressure chambers 12 and a portion extending in the second-pressure-chamber-line-side meandering pattern along the second pressure chamber line of the pressure chambers 12. In other words, the liquid ejecting head 510 in the first embodiment includes one resistance wire 401 for the first and second pressure chamber lines. In contrast, as illustrated in FIGS. 9 to 11, the liquid ejecting head 510 in this embodiment may include multiple temperature detectors for multiple pressure chamber groups of the pressure chambers 12. This enables the liquid ejecting head 510 to determine temperatures in the pressure chambers 12 in separate groups.

In this embodiment, as illustrated in FIG. 9, the pressure chamber groups include first, second, third, and fourth pressure chamber groups G1, G2, G3, and G4. The pressure chamber group G1 includes the pressure chambers 12 of the first pressure chamber line that are located on the −Y direction side of the center in the Y axis direction. The second pressure chamber group G2 includes the pressure chambers 12 of the first pressure chamber line that are located on the +Y direction side of the center in the Y axis direction. The third pressure chamber group G3 includes the pressure chambers 12 of the second pressure chamber line that are located on the −Y direction side of the center in the Y axis direction. The fourth pressure chamber group G4 includes the pressure chambers 12 of in the second pressure chamber line that are located on the +Y direction side of the center in the Y axis direction. The −Y direction side is an example of a first side in the first direction and the +Y direction side is an example of a second side in the first direction.

For example, as illustrated in FIG. 9, the liquid ejecting head 510 may include a resistance wire 402 (second resistance wire) and a resistance wire 403 (third resistance wire). The resistance wire 402, when viewed from the −Z direction, extends in a meandering pattern meandering in the Y axis direction over the supply communication passage 19 in communication with the pressure chambers 12 of the first pressure chamber line. The resistance wire 403, when viewed from the −Z direction, extends in a meandering pattern meandering in the Y axis direction over the supply communication passage 19 in communication with the pressure chambers 12 of the second pressure chamber line. The resistance wires 402 and 403 are each an example of the temperature detector for measuring temperature in the pressure chamber 12. The measurement lead electrode 93 may include measurement lead electrodes 93*a*, 93*b*, 93*c*, and 93*d*.

The resistance wire 402 extends continuously, and an end of the resistance wire 402 is coupled to the measurement lead electrode 93*a* and the other end of the resistance wire 402 is coupled to the measurement lead electrode 93*c*. The resistance wire 403 also extends continuously, and an end of the resistance wire 403 is coupled to the measurement lead electrode 93*b* and the other end of the resistance wire 403 is coupled to the measurement lead electrode 93*d*. In this configuration, the resistance wire 402 is electrically coupled to the wiring board 120, enabling the controller 580 to determine the electrical resistance value of the resistance wire 402. Furthermore, the resistance wire 403 is electrically coupled to the wiring board 120, enabling the controller 580 to determine the electrical resistance value of the resistance wire 403.

In this case, the pressure chamber groups include the first pressure chamber line and the second pressure chamber line. In some cases, the temperature of ink in the pressure chambers 12 of the first pressure chamber line differs from the temperature of ink in the pressure chambers 12 of the second pressure chamber line. In such cases, the liquid ejecting head 510 of this embodiment drives the piezoelectric devices 300 differently for different temperatures of ink in the pressure chambers 12 of the first and second pressure chamber lines. The liquid ejecting apparatus 500 having this configuration readily performs ejection control of the liquid ejecting head 510 appropriate for temperatures of ink in the pressure chambers 12.

Furthermore, for example, as illustrated in FIG. 10, the liquid ejecting head 510 may include a resistance wire 404 (fourth resistance wire) and a resistance wire 405 (fifth resistance wire). The resistance wire 404 has, when viewed from the −Z direction, a portion extending in a meandering pattern meandering in the Y axis direction over the supply communication passage 19 in communication with the pressure chambers 12 of the first pressure chamber group G1 and a portion extending in a meandering pattern meandering in the Y axis direction over the supply communication passage 19 in communication with the pressure chambers 12 of the third pressure chamber group G3. The resistance wire 405 has, when viewed from the −Z direction, a portion extending in a meandering pattern meandering in the Y axis direction over the supply communication passage 19 in communication with the pressure chambers 12 of the second pressure chamber group G2 and a portion extending in a meandering pattern meandering in the Y axis direction over the supply communication passage 19 in communication with the pressure chambers 12 of the fourth pressure chamber group G4. The resistance wires 404 and 405 are each an example of the temperature detector for measuring temperature in the pressure chamber 12. The measurement lead electrode 93 may include measurement lead electrodes 93*a*, 93*b*, 93*c*, and 93*d*.

The resistance wire 404 extends continuously, and an end of the resistance wire 404 is coupled to the measurement lead electrode 93*a* and the other end of the resistance wire 404 is coupled to the measurement lead electrode 93*b*. The resistance wire 405 also extends continuously, and an end of the resistance wire 405 is coupled to the measurement lead electrode 93*c* and the other end of the resistance wire 405 is coupled to the measurement lead electrode 93*d*. In this configuration, the resistance wire 404 is electrically coupled to the wiring board 120, enabling the controller 580 to determine the electrical resistance value of the resistance wire 404. Furthermore, the resistance wire 405 is electrically coupled to the wiring board 120, enabling the controller 580 to determine the electrical resistance value of the resistance wire 405.

In this case, the pressure chamber group includes the first and second pressure chamber groups G1 and G2. Alternatively, the pressure chamber group includes the third and fourth pressure chamber groups G3 and G4. In some cases, the temperature of ink in the pressure chambers 12 of the pressure chamber group located at a first side of the pressure chamber line differs from the temperature of ink in the pressure chambers 12 of the pressure chamber group located at a second side of the pressure chamber line, for example. In such cases, the liquid ejecting head 510 of this embodiment drives the piezoelectric devices 300 differently for different temperatures of ink in the pressure chambers 12 of the pressure chamber groups. The liquid ejecting apparatus 500 having this configuration readily performs ejection control of the liquid ejecting head 510 appropriate for temperatures of ink in the pressure chambers 12.

Furthermore, for example, as illustrated in FIG. 11, the liquid ejecting head 510 may include a resistance wire 406 (sixth resistance wire), a resistance wire 407 (seventh resistance wire), a resistance wire 408 (eighth resistance wire), and a resistance wire 409 (ninth resistance wire). The resistance wire 406 extends, when viewed from the −Z direction, in a meandering pattern meandering in the Y axis direction over the supply communication passage 19 in communication with the pressure chambers 12 of the first pressure chamber group G1. The resistance wire 407 extends, when viewed from the −Z direction, in a meandering pattern meandering in the Y axis direction over the supply communication passage 19 in communication with the pressure chambers 12 of the second pressure chamber group G2. The resistance wire 408 extends, when viewed from the −Z direction, in a meandering pattern meandering in the Y axis direction over the supply communication passage 19 in communication with the pressure chambers 12 of the third pressure chamber group G3. The resistance wire 409 extends, when viewed from the −Z direction, in a meandering pattern meandering in the Y axis direction over the supply communication passage 19 in communication with the pressure chambers 12 of the fourth pressure chamber group G4. The resistance wires 406, 407, 408, and 409 are each an example of the temperature detector for measuring temperature in the pressure chamber 12. The measurement lead electrode 93 may include measurement lead electrodes 93a, 93b, 93c, 93d, 93e, 93f, 93g, and 93h.

The resistance wire 406 extends continuously, and an end of the resistance wire 406 is coupled to the measurement lead electrode 93e and the other end of the resistance wire 406 is coupled to the measurement lead electrode 93a. The resistance wire 407 also extends continuously, and an end of the resistance wire 407 is coupled to the measurement lead electrode 93c and the other end of the resistance wire 407 is coupled to the measurement lead electrode 93g. The resistance wire 408 also extends continuously, and an end of the resistance wire 408 is coupled to the measurement lead electrode 93f and the other end of the resistance wire 408 is coupled to the measurement lead electrode 93b. The resistance wire 409 also extends continuously, and an end of the resistance wire 409 is coupled to the measurement lead electrode 93d and the other end of the resistance wire 409 is coupled to the measurement lead electrode 93h. In this configuration, the resistance wire 406 is electrically coupled to the wiring board 120, enabling the controller 580 to determine the electrical resistance value of the resistance wire 406. Furthermore, the resistance wire 407 is electrically coupled to the wiring board 120, enabling the controller 580 to determine the electrical resistance value of the resistance wire 407. Furthermore, the resistance wire 408 is electrically coupled to the wiring board 120, enabling the controller 580 to determine the electrical resistance value of the resistance wire 408. Furthermore, the resistance wire 409 is electrically coupled to the wiring board 120, enabling the controller 580 to determine the electrical resistance value of the resistance wire 409.

In this case, the pressure chamber groups include the first, second, third, and fourth pressure chamber groups G1, G2, G3, and G4. In some cases, the temperature of ink in the pressure chambers 12 of the first pressure chamber group G1, the temperature of ink in the pressure chambers 12 of the second pressure chamber group G2, the temperature of ink in the pressure chambers 12 of the third pressure chamber group G3, and the temperature of ink in the pressure chambers 12 of the fourth pressure chamber group G4 differ from each other, for example. In such cases, the liquid ejecting head 510 of this embodiment drives the piezoelectric devices 300 differently for different temperatures of ink in the pressure chambers 12 of the pressure chamber groups. The liquid ejecting apparatus 500 having this configuration readily performs ejection control of the liquid ejecting head 510 appropriate for temperatures of ink in the pressure chambers 12.

5. Fifth Embodiment

Next, a measurement lead electrode 93 and a resistance wire 410 included in a liquid ejecting head 510 of a fifth embodiment, which is an embodiment of the present disclosure, will be described. The components identical to those of the liquid ejecting head 510 in the first embodiment are assigned the same reference numerals as those in the first embodiment without duplicated explanation.

Figure 12:
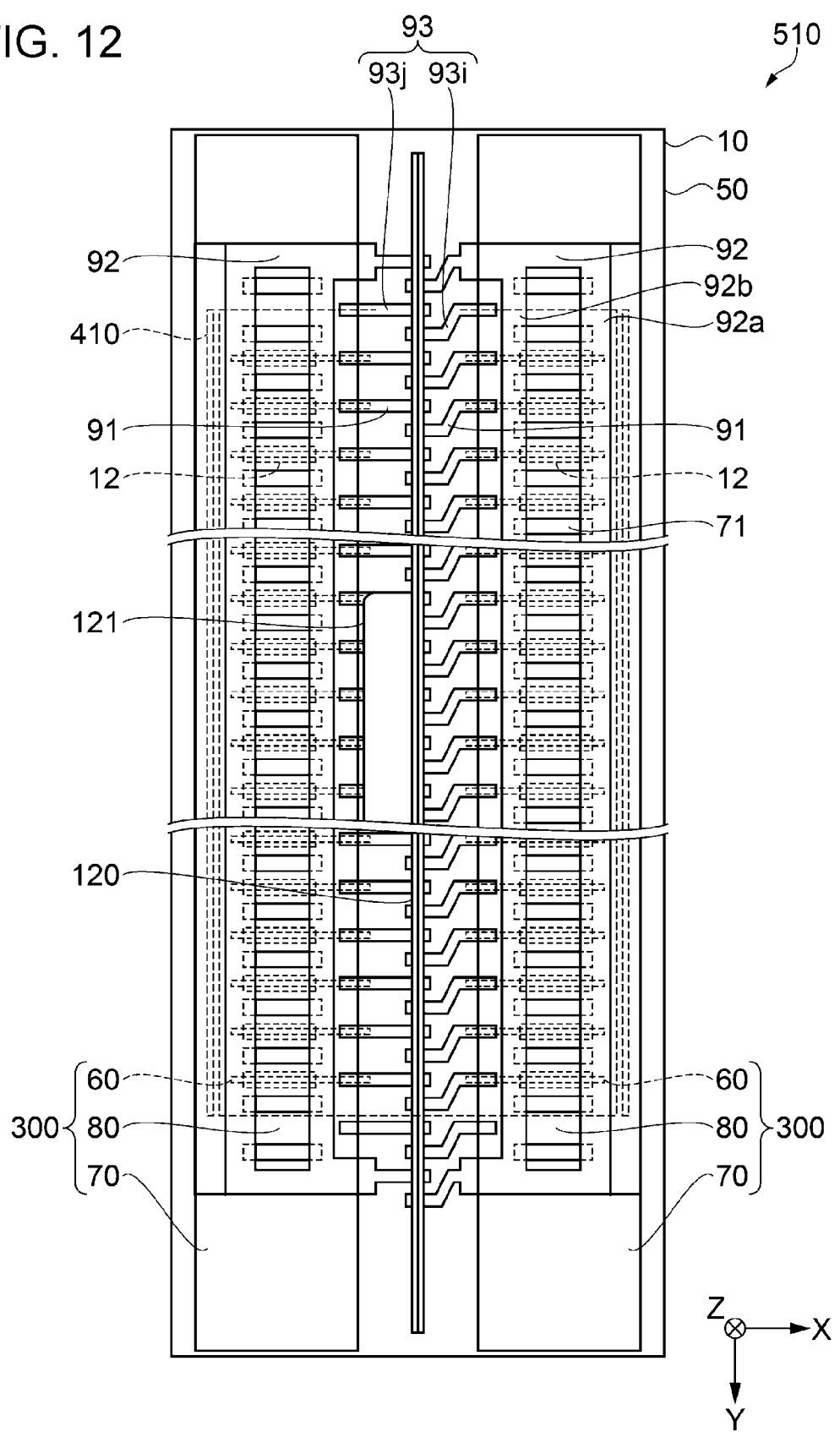
FIG. 12 is a plan view illustrating a liquid ejecting head according to a fifth embodiment.

The measurement lead electrode 93 in the first embodiment includes the measurement lead electrodes 93a and 93b, and an end of the resistance wire 401 is coupled to the measurement lead electrode 93a and the other end of the resistance wire 401 is coupled to the measurement lead electrode 93b. In contrast, as illustrated in FIG. 12, the measurement lead electrode 93 in this embodiment includes measurement lead electrodes 93i and 93j. The measurement lead electrodes 93 including the measurement lead electrodes 93i and 93j are each an example of a coupler through which the resistance wire 410 is coupled to the wiring board 120.

Furthermore, the liquid ejecting head 510 of this embodiment includes the resistance wire 410. The resistance wire 410 is an example of the temperature detector for measuring temperature in the pressure chamber 12. The resistance wire 410 extends continuously, and an end of the resistance wire 410 located at the +X direction side in the X axis direction is coupled to the measurement lead electrode 93i and the other end of the resistance wire 410 located at the −X direction side in the X axis direction is coupled to the measurement lead electrode 93j. In this configuration, the resistance wire 410 is electrically coupled to the wiring board 120, enabling the controller 580 to determine the electrical resistance value of the resistance wire 410.

The measurement lead electrode 93 in this embodiment is disposed between the individual lead electrode 91 and the common lead electrode 92 in the Y axis direction. In this configuration, the first electrode 60, the second electrode 80, and the resistance wire 410 are efficiently coupled to the wiring board 120.

Furthermore, the present embodiment, which includes the measurement lead electrode 93 between the individual lead electrode 91 and the common lead electrode 92 in the Y axis direction, may include multiple temperature detectors for respective pressure chamber groups as in the second to fourth embodiments.

The liquid ejecting heads 510 according to the above-described embodiments of the present disclosure and the liquid ejecting apparatus 500 according to the above-described embodiments basically have the above-described structures, but the components thereof may be partially modified or eliminated without departing from the gist of the present disclosure. Furthermore, the above-described embodiments and other embodiments described below may be combined without involving technical inconsistency. Other embodiments will be described below.

The controller 580 in the above-described embodiments does not need to have a function of measuring the electrical resistance value of the resistance wire 401 and determining the temperature in the pressure chamber 12. The liquid ejecting head 510 may have a function of measuring the electrical resistance value of the resistance wire 401 and determining the temperature in the pressure chamber 12. In such a case, for example, the liquid ejecting head 510 may include a temperature measurement circuit including memory SA storing a corresponding relationship between measurement values, which are obtained by the temperature detector, and temperatures, a measurement value acquisition portion MA configured to obtain the measurement value measured by the temperature detector, and a temperature acquisition portion TA configured to obtain a temperature by using the measurement value obtained by the measurement value acquisition portion MA and with reference to the corresponding relationship stored in the memory SA before the piezoelectric device 300 is driven. The measurement value obtained by the temperature detector may be an electrical resistance value. In such a case, the measurement value acquisition portion MA may be a resistance value acquisition portion MA. Alternatively, the liquid ejecting head 510 may include memory SA, a measurement value acquisition portion MA, and a temperature acquisition portion TA in the head circuit 121. In such a case, before the piezoelectric device 300 is driven, the liquid ejecting head 510 may measure the electrical resistance value of the resistance wire 401 and determine the temperature in the pressure chamber 12 with reference to the corresponding relationship between electrical resistance values of the resistance wire 401 and temperatures.

In the above-described embodiments, the method of measuring the electrical resistance value of the resistance wire 401 is not limited. For example, the electrical resistance value may be measured by using known two-terminal sensing or known four-terminal sensing.

In the above-described embodiments, the resistance wire does not have to be provided for all the pressure chambers 12. For example, in the first embodiment, the resistance wire 401 may only be provided for the pressure chambers 12 of the first pressure chamber line without being provided for the pressure chambers 12 of the second pressure chamber line. Alternatively, the resistance wire 401 may only be provided for some of the pressure chambers 12 of the first pressure chamber line and some of the pressure chambers 12 of the second pressure chamber line.

In the above-described embodiments, when viewed from the −Z direction, the meandering pattern of the resistance wire does not have to meander in the Y axis direction over the supply communication passage 19 in communication with the pressure chambers 12. For example, in the first embodiment, when viewed from the −Z direction, the first-pressure-chamber-line meandering pattern of the resistance wire 401 may meander in the X axis direction over the supply communication passage 19 in communication with the pressure chambers 12 of the first pressure chamber line.

In the above-described embodiments, when viewed from the −Z direction, the resistance wire does not have to meander when it is located over the supply communication passage 19 in communication with the corresponding pressure chambers 12.

In the above-described embodiments, when viewed from the −Z direction, the resistance wire may extend over the corresponding pressure chambers 12. For example, in the first embodiment, when viewed from the −Z direction, the resistance wire 401 may extend over the pressure chambers 12 at a position away from the first electrodes 60 in the Y axis direction.

In the above-described embodiments, the first electrode 60 may be a common electrode, and the second electrode 80 may be an individual electrode. In such a case, the first electrode 60 is disposed on the +Z direction side in the Z axis direction of the piezoelectric layer 70 and is shared by the pressure chambers 12. The second electrodes 80 are disposed on the −Z direction side in the Z axis direction of the piezoelectric layer 70 and are provided for the respective pressure chambers 12. In such a case, the first electrode 60 is coupled to the common lead electrode 92, and the second electrodes 80 are coupled to the individual lead electrodes 91.

Figure 13:
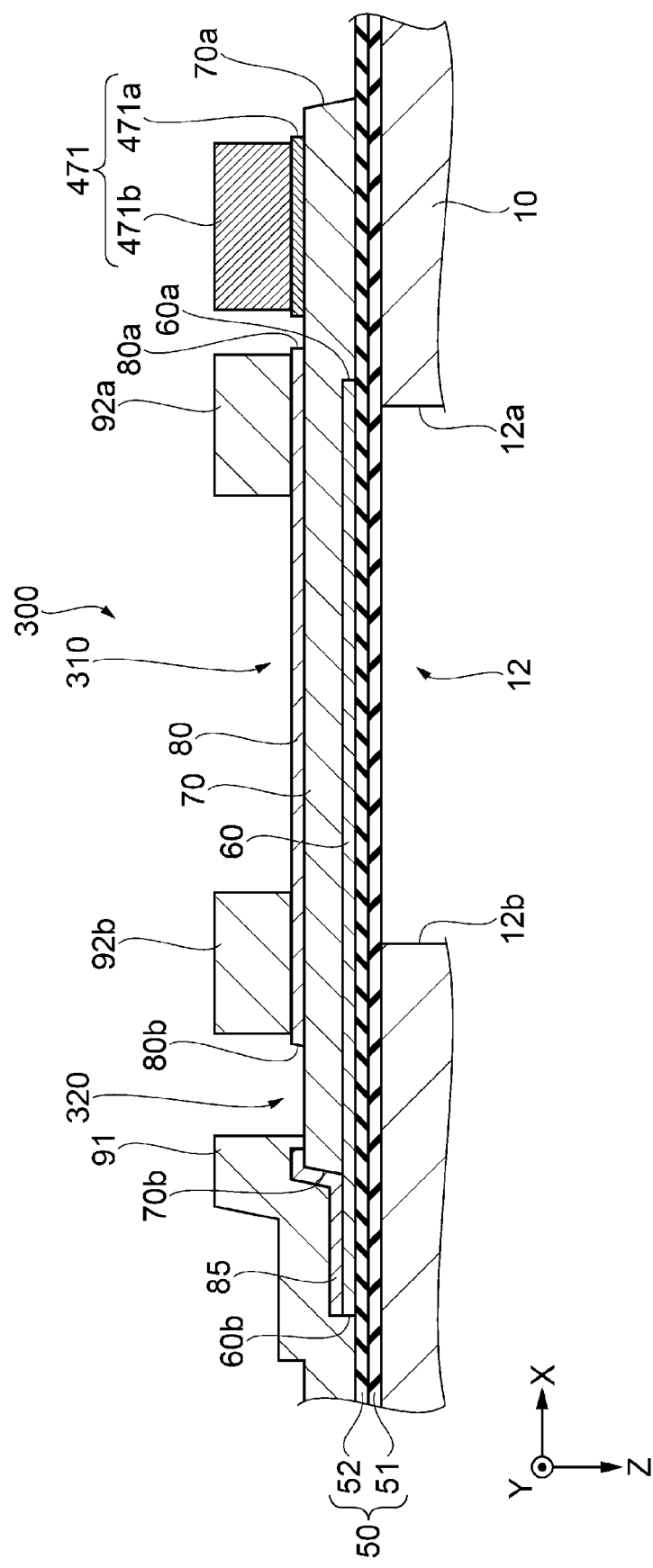
FIG. 13 is a detailed view illustrating main components of a liquid ejecting head according to another embodiment.

In the above-described embodiments, the temperature detector does not have to be the resistance wire and only needs to be a temperature detector that can provide a measurement value enabling determination of the temperature in the pressure chamber 12. The temperature detector may be a thermocouple. For example, in the first embodiment, the resistance wire 401 may be replaced with a thermocouple. In such a case, when viewed from the −Z direction, a measuring junction where first ends of two dissimilar metal wires of the thermocouple are coupled is located over the supply communication passage 19, which is in communication with the pressure chambers 12 of the first and second chamber lines. The second end of one of the metal wires is electrically coupled to the measurement lead electrode 93a and the second end of the other of the metal wires may be electrically coupled to the measurement lead electrode 93b. This enables the controller 580 to measure the thermoelectric force of the thermocouple, which is a potential difference between the second end of one of the metal wires and the second end of the other of the metal wires. Before the controller 580 drives the piezoelectric device 300, the controller 580 may measure the thermoelectric force of the thermocouple and determine the temperature in the pressure chamber 12 by using the thermoelectric force of the thermocouple and the temperature around the wiring board 120 measured by a temperature sensor separately disposed on the wiring board 120. In this case, the two dissimilar metal wires of the thermocouple may be located in the same layer as one of the first electrode 60, the second electrode 80, the individual lead electrode 91, and the common lead electrode 92. For example, as illustrated in FIG. 13, when the above-described configuration is applied to the first embodiment, a metal wire 471a, which is one of the two dissimilar metal wires of the thermocouple 471, is disposed on the surface of the piezoelectric layer 70 facing in the −Z direction so as to be in the same layer as the second electrode 80 and to be electrically discontinuous from the second electrode 80. Furthermore, a metal wire 471b, which is the other of the metal wires included in the thermocouple 471, is disposed on the surface of the metal wire 471a facing in the −Z direction so as to be in the same layer as the individual lead electrode 91 and the common lead electrode 92 and to be electrically discontinuous from the individual lead electrode 91 and the common lead electrode 92. Furthermore, the second electrode 80 may be formed of platinum (Pt), the metal wire 471a may be formed of platinum (Pt), and the metal wire 471b may be formed of gold (Au).

In the above-described embodiments, a discharge channel in communication with the nozzle 21 may be provided, and the ink may be ejected through the nozzle 21 while ink is circulated from a supply channel to the discharge channel via the nozzle 21. For example, as illustrated in FIG. 14, in addition to the supply opening 44 at the −X direction side, a discharge opening 200 may be disposed at the +X direction side. The two nozzle communication passages 16 are joined by a channel 201 extending in the X axis direction, and the channel 201 has the nozzle 21. In this case, a pump (not illustrated) controls the flow of ink such that the ink supplied through the supply opening 44 flows to, in this order, the pressure chamber 12 located at the −X direction side, the nozzle communication passages 16, and the pressure chamber 12 located at the +X direction side, and then flows out through the discharge opening 200. The cyclic operation of supply and discharge of ink is performed while ink is ejected through the nozzle 21. This suppresses an increase in viscosity of ink caused by ink evaporation, for example. In FIG. 14, two pressure chambers 12 are in communication with one nozzle 21, and two piezoelectric devices 300 are driven to eject ink from one nozzle 21. However, one pressure chamber 12 may be in communication with one nozzle 21. For example, in FIG. 14, the piezoelectric device 300 at the −X direction side may be eliminated.

What is claimed is:

1. A liquid ejecting head comprising:
    a piezoelectric device including a first electrode, a second electrode, and a piezoelectric layer located between the first electrode and the second electrode in a stacking direction in which the first electrode, the second electrode, and the piezoelectric layer are stacked on top of one another;
    a vibration plate disposed on a first side in the stacking direction of the piezoelectric device and subjected to deformation when the piezoelectric device is driven;
    a pressure chamber plate disposed on the first side in the stacking direction of the vibration plate and including a plurality of pressure chambers whose volume is changed by deformation of the vibration plate;
    a wiring board;
    a first wire through which the wiring board and the first electrode are electrically coupled to each other;
    a second wire through which the wiring board and the second electrode are electrically coupled to each other;
    a temperature detector electrically coupled to the wiring board and used to determine a temperature in the plurality of pressure chambers, the temperature detector being formed of the same material as the first electrode;
    a first measurement electrode that electrically coupled with the wiring board and one edge of the temperature detector; and
    a second measurement electrode that electrically coupled with the wiring board and the other edge of the temperature detector.

2. The liquid ejecting head according to claim 1, wherein the temperature detector includes temperature detectors provided for corresponding pressure chamber groups of the pressure chambers.

3. The liquid ejecting head according to claim 2, wherein a direction intersecting the stacking direction is a first direction,
    the pressure chambers are arranged in the first direction to form a pressure chamber line, and
    the pressure chamber groups include a first pressure chamber group of the pressure chambers at a first side in the first direction of the pressure chamber line and a second pressure chamber group of the pressure chambers at a second side in the first direction of the pressure chamber line.

4. The liquid ejecting head according to claim 2, wherein a direction intersecting the stacking direction is a first direction and a direction intersecting the stacking direction and the first direction is a second direction, and
    the pressure chamber groups include a first pressure chamber line in which the pressure chambers are arranged in the first direction and a second pressure chamber line away from the first pressure chamber line in the second direction and in which the pressure chambers are arranged in the first direction.

5. The liquid ejecting head according to claim 2, wherein a direction intersecting the stacking direction is a first direction and a direction intersecting the stacking direction and the first direction is a second direction,
    the pressure chambers include a first pressure chamber line which the pressure chambers are arranged in the first direction and a second pressure chamber line that is away from the first pressure chamber line in the second direction and in which the pressure chambers are arranged in the first direction, and
    the pressure chamber groups include: a first pressure chamber group of the pressure chambers at a first side in the first direction of the first pressure chamber line; a second pressure chamber group of the pressure chambers at a second side in the first direction of the first pressure chamber line; a third pressure chamber group of the pressure chambers at the first side in the first direction of the second pressure chamber line; and a fourth pressure chamber group of the pressure chambers at the second side in the first direction of the second pressure chamber line.

6. The liquid ejecting head according to claim 1, wherein a direction intersecting the stacking direction is a first direction,
    the first electrode is provided for each of the pressure chambers arranged in the first direction,
    the second electrode is shared by the pressure chambers,
    the first electrode is disposed on the first side in the stacking direction of the piezoelectric layer, and
    the second electrode is disposed on a second side in the stacking direction of the piezoelectric layer.

7. The liquid ejecting head according to claim 6, wherein the wiring board includes a head circuit, and
    the head circuit is configured to apply a drive voltage that varies depending on an ejection amount of liquid to the first electrode through the first wire and configured to apply a hold voltage that is constant regardless of an ejection amount of liquid to the second electrode through the second wire regardless of the ejection amount of liquid.

8. The liquid ejecting head according to claim 6, wherein the first wire is disposed, in the first direction, between the second wire and the fire measurement electrode.

9. The liquid ejecting head according to claim 1, further comprising:
    a resistance acquisition portion configured to obtain an electrical resistance value of the temperature detector; and
    a temperature acquisition portion configured to obtain a temperature by using the electrical resistance value obtained by the resistance acquisition portion before the piezoelectric device is driven.

10. The liquid ejecting head according to claim 9, wherein the resistance acquisition portion is configured to obtain the electrical resistance value by using one of two-terminal sensing and four-terminal sensing.

11. The liquid ejecting head according to claim 10, further comprising memory that stores a corresponding relationship between temperatures and electrical resistance values of a material of the temperature detector, wherein
the temperature acquisition portion is configured to obtain a temperature with reference to the corresponding relationship in the memory and by using the electrical resistance value obtained by the resistance acquisition portion before the piezoelectric device is driven.

12. A liquid ejecting apparatus comprising:
the liquid ejecting head according to claim 1; and
a controller configured to control ejection of a liquid from the liquid ejecting head.

* * * * *